(12) United States Patent
Tomita

(10) Patent No.: US 12,074,995 B2
(45) Date of Patent: Aug. 27, 2024

(54) RADIO-FREQUENCY MODULE AND COMMUNICATION DEVICE

(71) Applicant: Murata Manufacturing Co., Ltd., Kyoto (JP)

(72) Inventor: Naohide Tomita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 49 days.

(21) Appl. No.: 17/453,264

(22) Filed: Nov. 2, 2021

(65) Prior Publication Data

US 2022/0182472 A1 Jun. 9, 2022

(30) Foreign Application Priority Data

Dec. 7, 2020 (JP) .................................. 2020-203023

(51) Int. Cl.
*H04M 1/02* (2006.01)

(52) U.S. Cl.
CPC .................................. *H04M 1/026* (2013.01)

(58) Field of Classification Search
CPC .............. H04M 1/026; H03F 2200/451; H03F 2200/534; H03F 2200/537; H03F 2200/541; H03F 1/0216; H03F 1/07; H03F 3/189; H03F 3/195; H03F 3/211; H03F 3/245; H04B 1/40
See application file for complete search history.

(56) References Cited

U.S. PATENT DOCUMENTS

| 10,826,457 B2 * | 11/2020 | Chi | H03F 3/45179 |
| 11,121,676 B1 * | 9/2021 | Ba | H03F 3/2173 |
| 11,271,597 B1 * | 3/2022 | Huang | H04B 1/04 |
| 2007/0069835 A1 * | 3/2007 | Kamgaing | H03H 5/02 333/185 |

(Continued)

FOREIGN PATENT DOCUMENTS

| JP | 2013-085179 A | 5/2013 |
| JP | 2018-137566 A | 8/2018 |

OTHER PUBLICATIONS

English Translation for JP2013085179A, Kuriyama Yasuhiko, May 9, 2013 (Year: 2013).*

*Primary Examiner* — Jinsong Hu
*Assistant Examiner* — Rui M Hu
(74) *Attorney, Agent, or Firm* — Pearne & Gordon LLP

(57) ABSTRACT

A radio-frequency module includes a module substrate and a power amplification circuit that includes first to fourth amplification elements, a transformer including primary and secondary coils, an output terminal to which the secondary coil is connected, and a circuit component disposed on the module substrate. Output terminals of the first and third amplification elements and output terminals of the second and fourth amplification elements are respectively connected to a first terminal and a second terminal of the primary coil. A capacitor is connected to a wiring line path connected between the output terminal of the first amplification element and the first terminal of the primary coil and to a wiring line path connected between the output terminal of the second amplification element and the second terminal of the primary coil. The primary or secondary coil includes a conductive layer surrounding at least part of the circuit component.

18 Claims, 12 Drawing Sheets

(56) References Cited

U.S. PATENT DOCUMENTS

| | | | | |
|---|---|---|---|---|
| 2011/0063028 A1* | 3/2011 | Kawakami | ............. | H03F 3/602 |
| | | | | 330/252 |
| 2013/0099864 A1* | 4/2013 | Kawai | ............. | H03F 3/245 |
| | | | | 330/276 |
| 2013/0285763 A1* | 10/2013 | Granger-Jones | ......... | H03H 7/48 |
| | | | | 333/111 |
| 2014/0097907 A1* | 4/2014 | Yoon | ............. | H01L 23/5227 |
| | | | | 330/307 |
| 2014/0273825 A1* | 9/2014 | Sapone | ............. | H01L 23/66 |
| | | | | 257/664 |
| 2017/0324381 A1* | 11/2017 | Qian | ............. | H03F 1/56 |
| 2018/0233967 A1* | 8/2018 | Peralta | ............. | H01F 38/14 |
| 2018/0241362 A1 | 8/2018 | Takenaka | | |
| 2019/0148047 A1* | 5/2019 | Asano | ............. | H03H 7/1725 |
| | | | | 331/177 R |
| 2019/0189608 A1* | 6/2019 | Cheng | ............. | H01L 28/90 |
| 2019/0259701 A1* | 8/2019 | Cheng | ............. | H01L 23/5227 |
| 2020/0099348 A1* | 3/2020 | Gebeyehu | ............. | H03F 1/565 |
| 2021/0203289 A1* | 7/2021 | Honda | ............. | H03F 3/195 |
| 2021/0384867 A1* | 12/2021 | Imai | ............. | H03F 1/0288 |
| 2021/0391835 A1* | 12/2021 | Kazuno | ............. | H03F 3/26 |
| 2021/0399701 A1* | 12/2021 | Honda | ............. | H03F 3/195 |
| 2022/0006437 A1* | 1/2022 | Namie | ............. | H03F 3/45475 |
| 2022/0029588 A1* | 1/2022 | Cao | ............. | H03F 1/565 |
| 2022/0077828 A1* | 3/2022 | Honda | ............. | H03F 3/193 |
| 2022/0173700 A1* | 6/2022 | Dinc | ............. | H03F 1/02 |

* cited by examiner

RADIO-FREQUENCY MODULE AND COMMUNICATION DEVICE

CROSS REFERENCE TO RELATED APPLICATION

This application claims priority from Japanese Patent Application No. 2020-203023 filed on Dec. 7, 2020. The content of this application is incorporated herein by reference in its entirety.

BACKGROUND

The present disclosure relates to a radio-frequency module and a communication device.

Heretofore, power amplification circuits that include transformers are known (for example, refer to Japanese Unexamined Patent Application Publication Nos. 2018-137566 and 2013-85179).

Power amplification circuits that include transformers tend to have a greater number of constituent components than power amplification circuits that do not include transformers. There is a problem in that a module including such a power amplification circuit is increased in size as the number of components increases.

BRIEF SUMMARY

The present disclosure provides a small-sized radio-frequency module that includes a power amplification circuit including a transformer and to provide a communication device including the radio-frequency module.

A radio-frequency module according to an embodiment of the present disclosure includes a module substrate and a power amplification circuit provided on or in the module substrate. The power amplification circuit includes a first amplification element, a second amplification element, a third amplification element, and a fourth amplification element, a transformer including a primary coil and a secondary coil, an output terminal to which one end of the secondary coil is connected, and a first component disposed on a main surface of the module substrate. An output terminal of the first amplification element and an output terminal of the third amplification element are connected to a first terminal of the primary coil. An output terminal of the second amplification element and an output terminal of the fourth amplification element are connected to a second terminal of the primary coil. A first capacitance element is connected to a first wiring line path connected between the output terminal of the first amplification element and the first terminal and to a second wiring line path connected between the output terminal of the second amplification element and the second terminal. One out of the primary coil and the secondary coil includes a first conductive layer provided on or in the module substrate. The first conductive layer surrounds at least part of the first component when the module substrate is viewed in plan view.

A radio-frequency module according to an embodiment of the present disclosure includes a module substrate and a power amplification circuit provided on or in the module substrate. The power amplification circuit includes a first amplification element, a second amplification element, a third amplification element, and a fourth amplification element, a first transformer including a first primary coil and a first secondary coil, a second transformer including a second primary coil and a second secondary coil, an output terminal to which one end of the first secondary coil is connected, and a first component disposed on a main surface of the module substrate. One end of the first primary coil is connected to an output terminal of the first amplification element. The other end of the first primary coil is connected to an output terminal of the second amplification element. One end of the second primary coil is connected to an output terminal of the third amplification element. The other end of the second primary coil is connected to an output terminal of the fourth amplification element. The other end of the first secondary coil is connected to one end of the second secondary coil. A capacitance element is connected to a wiring line path connected between the other end of the first secondary coil and the one end of the second secondary coil. At least one out of the first primary coil, the first secondary coil, the second primary coil, and the second secondary coil includes a conductive layer provided on or in the module substrate. The conductive layer surrounds at least part of the first component when the module substrate is viewed in plan view.

A communication device according to an embodiment of the present disclosure includes an RF signal processing circuit that processes a radio-frequency signal transmitted or received by an antenna, and the radio-frequency module according to the above-described embodiment, which transmits a radio-frequency signal between the antenna and the RF signal processing circuit.

According to the present disclosure, a small-sized radio-frequency module that includes a power amplification circuit including a transformer can be provided.

Other features, elements, characteristics and advantages of the present disclosure will become more apparent from the following detailed description of embodiments of the present disclosure with reference to the attached drawings.

DETAILED DESCRIPTION

Figure 1:
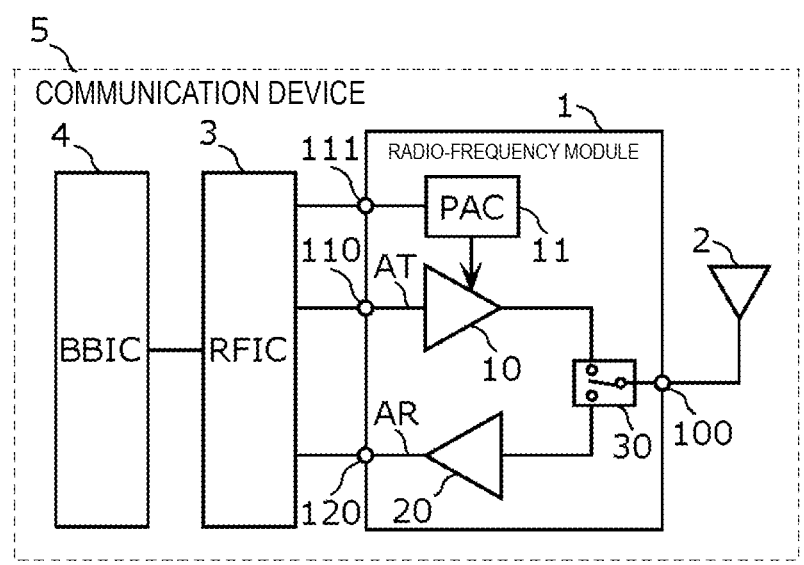
FIG. 1 is a circuit diagram of a radio-frequency module and a communication device according to Embodiment 1.

Hereafter, radio-frequency modules and communication devices according to embodiments of the present disclosure will be described using the drawings. The embodiments described hereafter each illustrates a specific example of the present disclosure. Therefore, the numerical values, shapes, materials, constituent elements, arrangements of the constituent elements, the ways in which the constituent elements are connected, steps, the order of the steps, and so forth described in the following embodiments are merely examples and are not intended to limit the present disclosure. Therefore, constituent elements not described in the independent claims among constituent elements in the following embodiments are described as arbitrary constituent elements.

In addition, the drawings are schematic drawings and are not necessarily illustrated in a strictly accurate manner. Therefore, for example, the scale and so forth in the individual drawings are not necessarily the same. Furthermore, in the drawings, configurations that are substantially the same as each other are denoted by the same symbols and repeated description thereof is omitted or simplified.

In addition, in this specification, terms indicating the relationships between elements, such as parallel or perpendicular, and terms indicating the shape of elements, such as rectangular or straight, and numerical ranges are not expressions that express only a strict meaning, but rather are expressions that are intended to include substantially equivalent ranges, for example, differences of a several percent.

In addition, in this specification, terms, such as "up" and "down" do not refer to an upward direction (vertically upward) and a downward direction (vertically downward) in the sense of absolute spatial perception, but are rather used as terms defined by relative positional relationships based on the order in which layers are stacked in a multilayer configuration. Therefore, for example, the "upper surface" or the "top surface" of a component or member may be a surface facing in any of various directions during actual use. Note that the "top surface" of a component or a member refers to the uppermost surface of the component or member.

In addition, in this specification, the meaning of "connected" includes not only directly connected with connection terminals and/or wiring conductors, but also electrical connections realized via other circuit elements. Furthermore, "connected between A and B" means connected to both A and B between A and B.

In addition, in the arrangements of components in the present disclosure, "viewing the module substrate in plan view" is equivalent to "viewing a main surface of the module substrate in plan view" and refers to viewing, from the front, a main surface of the module substrate with objects being orthographically projected onto the main surface. In this specification, unless stated otherwise, "viewing in plan view" means "viewing a main surface of the module substrate in plan view".

In addition, "A surrounds B" means that at least one out of a plurality of line segments connecting any two points inside A passes through B.

In addition, an "outline of A" is at least part of a line forming the outer shape of A in plan view. An "outline of A surrounding B" includes an "an outer-peripheral-side outline" and an "inner-peripheral-side outline". An "inner-peripheral-side outline" is an "outline" that is nearer B than an "outer-peripheral-side outline" is. One point on the "inner-peripheral-side outline" is located on a line segment connecting an arbitrary point on the "outer-peripheral-side outline" and a point inside B.

In addition, the meaning of "a component is disposed on a main surface of a substrate" includes not only a case in which the component is disposed on the main surface so as to contact the main surface of the substrate, but also a case in which the component is disposed above the main surface without necessarily contacting the main surface and a case in which the component is disposed so as to be partially embedded inside the substrate from the main surface.

In addition, in this specification, ordinal numbers, such as "first" and "second" do not mean the number or order of components unless otherwise stated, and rather are used for the purpose of avoiding confusion and distinguishing between components of the same type.

In addition, in this specification, "transmission path" refers to a transmission line consisting of wiring lines that transmit radio-frequency transmission signals, electrodes directly connected to the wiring lines, terminals directly connected to the wiring lines or electrodes, and so forth. In addition, "reception path" refers to a transmission line consisting of wiring lines that transmit radio-frequency reception signals, electrodes directly connected to the wiring lines, terminals directly connected to the wiring lines or electrodes, and so forth. In addition, "transmission/reception path" refers to a transmission line consisting of wiring lines that transmit both radio-frequency transmission signals and radio-frequency reception signals, electrodes directly connected to the wiring lines, terminals directly connected to the wiring lines or electrodes, and so forth.

Embodiment 1

1-1. Circuit Configurations of Radio-Frequency Module and Communication Device

First, the circuit configurations of a radio-frequency module and a communication device according to Embodiment 1 will be described using FIG. 1. FIG. 1 is a circuit diagram of a radio-frequency module 1 and a communication device 5 according to this embodiment.

1-1-1. Circuit Configuration of Communication Device

First, the circuit configuration of the communication device 5 will be described. The communication device 5 is a device that is used in a communication system and is a portable terminal such as a smart phone or a tablet computer. As illustrated in FIG. 1, the communication device 5 according to this embodiment includes the radio-frequency module 1, an antenna 2, an RF signal processing circuit (RFIC) 3, and a baseband signal processing circuit (BBIC) 4.

The radio-frequency module 1 transmits radio-frequency signals between the antenna 2 and the RFIC 3. The internal configuration of the radio-frequency module 1 will be described later.

The antenna 2 is connected to an antenna connection terminal 100 of the radio-frequency module 1 and transmits radio-frequency signals (transmission signals) output from the radio-frequency module 1. In addition, the antenna 2 receives radio-frequency signals (reception signals) from the outside and outputs the received radio-frequency signals to the radio-frequency module 1.

The RFIC 3 is an example of a signal processing circuit that processes radio-frequency signals transmitted and received by the antenna 2. Specifically, the RFIC 3 subjects a radio-frequency reception signal input thereto via a reception path AR of the radio-frequency module 1 to signal processing using down conversion and so forth and outputs a reception signal generated through this signal processing to the BBIC 4. In addition, the RFIC 3 subjects a transmission signal input thereto from the BBIC 4 to signal processing using up conversion and so forth and outputs a radio-frequency transmission signal generated through this signal processing to a transmission path AT of the radio-frequency module 1. In addition, the RFIC 3 includes a control unit that controls switches, amplification circuits, and so forth of the radio-frequency module 1. Some or all of the functions of the control unit of the RFIC 3 may be implemented outside the RFIC 3, for example, in the BBIC 4 or the radio-frequency module 1.

The BBIC 4 is a base band signal processing circuit that performs signal processing using an intermediate frequency band located at a lower frequency than radio-frequency signals that are transmitted by the radio-frequency module 1. A signal processed by the BBIC 4 is used as an image signal for image display and/or as an audio signal for a telephone call via a speaker, for example.

Note that the antenna 2 and the BBIC 4 are optional constituent elements of the communication device 5 according to this embodiment.

1-1-2. Circuit Configuration of Radio-Frequency Module

Next, the circuit configuration of the radio-frequency module 1 will be described.

As illustrated in FIG. 1, the radio-frequency module 1 includes a power amplification circuit 10, a PA control circuit (PAC) 11, a low-noise amplifier 20, and a switch 30. In addition, the radio-frequency module 1 is provided with the antenna connection terminal 100, a control input terminal 111, a transmission input terminal 110, and a reception output terminal 120 as external connection terminals.

The antenna connection terminal 100 is connected to the antenna 2.

The control input terminal 111 is a terminal for receiving digital signals for controlling the gain of the power amplification circuit 10 and a power supply voltage and bias voltage supplied to the power amplification circuit 10. For example, the control input terminal 111 is a mobile industry processor interface (MIPI) terminal and receives digital signals from the RFIC 3.

The transmission input terminal 110 is a terminal for receiving transmission signals from outside the radio-frequency module 1 (specifically, from the RFIC 3).

The reception output terminal 120 is a terminal for supplying reception signals to outside the radio-frequency module 1 (specifically, to the RFIC 3).

The transmission path AT along which transmission signals are transmitted and the reception path AR along which reception signals are transmitted are provided in the radio-frequency module 1. The transmission path AT is a path connected between the transmission input terminal 110 and the antenna connection terminal 100. The reception path AR is a path connected between the reception output terminal 120 and the antenna connection terminal 100. Part of the transmission path AT and part of the reception path AR are formed of a shared path. In other words, this shared part is a transmission/reception path that transmits both transmission signals and reception signals.

The power amplification circuit 10 is an example of an amplification circuit that amplifies a radio-frequency signal. The power amplification circuit 10 is disposed on the transmission path AT and is a transmission amplification circuit that amplifies transmission signals of one or more communication bands. A specific circuit configuration of the power amplification circuit 10 will be described later.

The low-noise amplifier 20 is an example of an amplification circuit that amplifies a radio-frequency signal. The low-noise amplifier 20 is disposed on the reception path AR and is a reception amplification circuit that amplifies reception signals of one or more communication bands.

"Communication bands" refers to frequency bands predefined by a standardization organization (e.g., third Generation Partnership Project (3GPP), Institute of Electrical and Electronics Engineers (IEEE), and so on) for communication systems. The communication bands may be communication bands used with a frequency division duplex (FDD) system or may be communication bands used with a time division duplex (TDD) system.

The term "communication system" used here refers to a communication system constructed using radio access technology (RAT). For example, the fifth generation new radio (5GNR) system, the long term evolution (LTE) system, and the wireless local area network (WLAN) system can be used as a communication system, but the communication system is not limited to these systems.

The switch 30 is connected between the antenna connection terminal 100 and the power amplification circuit 10 and the low-noise amplifier 20. The switch 30 is also called an antenna switch. The switch 30 switches a connection between the antenna connection terminal 100 and the power amplification circuit 10 and a connection between the antenna connection terminal 100 and the low-noise amplifier 20 on the basis of control signals from the RFIC 3, for example. The switch 30 is, for example, a single-pole double-throw (SPDT) switch circuit.

The switch 30 is a switch for switching between transmission and reception, but may instead be a switch for switching between different communication bands. In other words, the radio-frequency module 1 may be capable of transmitting and receiving radio-frequency signals of a plurality of communication bands. For example, the radio-frequency module 1 may be capable of performing at least any one of (1) transmission and reception of radio-frequency signals of communication band A, (2) transmission and reception of radio-frequency signals of communication band B, which is different from communication band A, and (3) simultaneous transmission, simultaneous reception, or simultaneous transmission and reception of a radio-frequency signal of communication band A and a radio-frequency signal of communication band B.

Furthermore, the radio-frequency module 1 may include a transmission filter and/or a reception filter that has at least part of a communication band as the pass band thereof. A plurality of transmission filters and/or reception filters may form a duplexer or a multiplexer. In addition, the radio-frequency module 1 may include one or more impedance matching networks.

In addition, in the radio-frequency module 1, the transmission path AT and the reception path AR may be isolated from each other. For example, the transmission path AT and the reception path AR may be respectively connected to the antenna 2 through different terminals. In addition, the radio-frequency module 1 may include only the transmission path AT. For example, the radio-frequency module 1 does not have to include the low-noise amplifier 20 and the switch 30.

1-1-3. Circuit Configuration of Power Amplification Circuit

Figure 2:
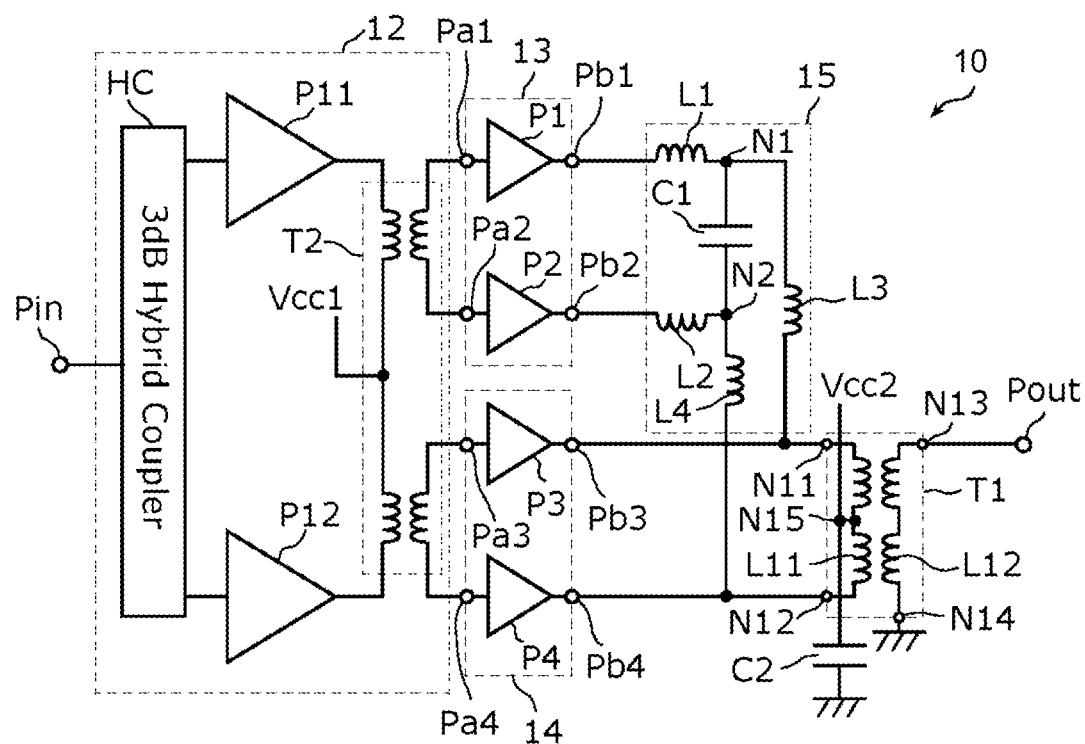
FIG. 2 is a circuit diagram of a power amplification circuit of the radio-frequency module according to Embodiment 1.

Next, the circuit configuration of the power amplification circuit 10 will be described using FIG. 2. FIG. 2 is a circuit diagram of the power amplification circuit 10 of the radio-frequency module 1 according to this embodiment.

As illustrated in FIG. 2, the power amplification circuit 10 includes an input terminal Pin, an output terminal Pout, a power splitter 12, a carrier amplifier 13, a peak amplifier 14, a phase conversion circuit 15, a transformer T1, and a capacitor C2. The power amplification circuit 10 is a differential Doherty power amplification circuit (differential Doherty amplification circuit).

The power splitter 12 splits a radio-frequency signal (input signal) input to the input terminal Pin of the power amplification circuit 10 into four radio-frequency signals. The four radio-frequency signals are respectively output to input terminals Pa1 and Pa2 of the carrier amplifier 13 and input terminals Pa3 and Pa4 of the peak amplifier 14.

As illustrated in FIG. 2, the power splitter 12 includes a hybrid coupler HC, amplification elements P11 and P12, and a transformer T2. The hybrid coupler HC splits an input signal into a first radio-frequency signal and a second radio-frequency signal whose phase is shifted by a prescribed amount from the first radio-frequency signal. For example, the second radio-frequency signal is a signal whose phase is advanced by around λ/4 (around 90°) from the first radio-frequency signal. λ is the wavelength of the input signal.

The first radio-frequency signal is amplified by the amplification element P11 and input to one end of a primary coil of the transformer T2. The second radio-frequency signal is amplified by the amplification element P12 and input to the other end of the primary coil of the transformer T2. A power supply voltage Vcc1 is supplied to the center of the primary coil of the transformer T2.

The transformer T2 includes the primary coil and two secondary coils. The two ends of one of the secondary coils are respectively connected to the input terminals Pa1 and Pa2 of the carrier amplifier 13. The two ends of other secondary coil are respectively connected to the input terminals Pa3 and Pa4 of the peak amplifier 14. With this configuration, the transformer T2 transforms each of the amplified first radio-frequency signal and the amplified second radio-frequency signal into radio-frequency signals having the same amplitude and opposite phases.

The first radio-frequency signals having the same amplitude and opposite phases are respectively input to the input terminals Pa1 and Pa2 of the carrier amplifier 13. The first radio-frequency signals are signals that are split from the input signal when the power level of the input signal is greater than or equal to a first level. The second radio-frequency signals having the same amplitude and opposite phases are respectively input to the input terminals Pa3 and Pa4 of the peak amplifier 14. The second radio-frequency signals are signals that are split from the input signal when the power level of the input signal is greater than or equal to a second level, which is a higher level than the first level. Note that signals having the same amplitude and opposite phases are also referred to as differential signals or complementary signals.

The carrier amplifier 13 includes amplification elements P1 and P2, the input terminals Pa1 and Pa2, and output terminals Pb1 and Pb2. The carrier amplifier 13 amplifies the first radio-frequency signals having the same amplitude and opposite phases input to the input terminals Pa1 and Pa2 thereof and outputs the resulting amplified first radio-frequency signals having the same amplitude and opposite phases from the output terminals Pb1 and Pb2 thereof.

The amplification element P1 is an example of a first amplification element and amplifies a radio-frequency signal input to the input terminal Pa1 thereof and outputs the amplified radio-frequency signal from the output terminal Pb1 thereof. The input terminal Pa1 is the input terminal of the amplification element P1 and the output terminal Pb1 is the output terminal of the amplification element P1.

The amplification element P2 is an example of a second amplification element and amplifies a radio-frequency signal input to the input terminal Pa2 thereof and outputs the amplified radio-frequency signal from the output terminal Pb2 thereof. The input terminal Pa2 is the input terminal of the amplification element P2 and the output terminal Pb2 is the output terminal of the amplification element P2.

The peak amplifier 14 includes amplification elements P3 and P4, the input terminals Pa3 and Pa4, and output terminals Pb3 and Pb4. The peak amplifier 14 amplifies the second radio-frequency signals having the same amplitude and opposite phases input to the input terminals Pa3 and Pa4 thereof and outputs the resulting amplified second radio-frequency signals having the same amplitude and opposite phases from the output terminals Pb3 and Pb4 thereof.

The amplification element P3 is an example of a third amplification element and amplifies a radio-frequency signal input to the input terminal Pa3 thereof and outputs the amplified radio-frequency signal from the output terminal Pb3 thereof. The input terminal Pa3 is the input terminal of the amplification element P3 and the output terminal Pb3 is the output terminal of the amplification element P3.

The amplification element P4 is an example of a fourth amplification element and amplifies a radio-frequency signal input to the input terminal Pa4 thereof and outputs the amplified radio-frequency signal from the output terminal Pb4 thereof. The input terminal Pa4 is the input terminal of the amplification element P4 and the output terminal Pb4 is the output terminal of the amplification element P4.

The amplification elements P1 and P2 of the carrier amplifier 13 are biased in Class A to Class AB, for example. The amplification elements P3 and P4 of the peak amplifier 14 are biased in Class C, for example. Thus, the carrier amplifier 13 is turned on irrespective of the power level of the input signal, and the peak amplifier 14 is turned on only in the case where the power level of the input signal is comparatively large.

The amplification elements P1 to P4 are bipolar transistors such as heterojunction bipolar transistors (HBT), for example, but do not have to be bipolar transistors. The amplification elements P1 to P4 may be electric field effect transistors such as metal oxide semiconductor field effect transistors (MOSFETs).

The phase conversion circuit 15 includes inductors L1 to L4 and a capacitor C1. The inductors L1 and L3 are connected in series between the output terminal Pb1 of the amplification element P1 and a terminal N11 of a primary coil L11 of the transformer T1. The inductors L2 and L4 are connected in series between the output terminal Pb2 of the amplification element P2 and a terminal N12 of the primary coil L11 of the transformer T1.

The capacitor C1 is an example of a first capacitance element and is connected between a node N1 and a node N2. The node N1 is an example of a first connection point to which one end of the capacitor C1 is connected. In addition, the node N1 is an example of a first node on a first wiring line path between the output terminal Pb1 and the terminal N11. The node N1 corresponds to a connection point between the inductor L1 and the inductor L3. The node N2 is an example of a second connection point to which the other end of the capacitor C1 is connected. In addition, the node N2 is an example of a second node on a second wiring line path between the output terminal Pb2 and the terminal N12. The node N2 corresponds to a connection point between the inductor L2 and the inductor L4.

The phase conversion circuit 15 is adjusted so as to shift the phases of radio-frequency signals output from the carrier amplifier 13 by a prescribed amount. Specifically, the phase conversion circuit 15 is adjusted so as to advance the phases of the radio-frequency signals output from the carrier amplifier 13 by around λ/4 (around 90°). Specifically, the inductance value of the inductor L1 is equal to the inductance value of the inductor L2. In addition, the inductance value of the inductor L3 is equal to the inductance value of the inductor L4.

The transformer T1 includes the primary coil L11 and a secondary coil L12, which are electromagnetically coupled with each other. The transformer T1 conveys a signal input to the primary coil L11 to the secondary coil L12. The transformer T1 combines the first radio-frequency signals amplified by the carrier amplifier 13 and phase shifted by the phase conversion circuit 15 and the second radio-frequency signals amplified by the peak amplifier 14, performs impedance conversion, and outputs the resulting signal from the output terminal Pout.

The output terminal Pb1 of the amplification element P1 and the output terminal Pb3 of the amplification element P3 are connected to the terminal N11, which is a first terminal of the primary coil L11. The output terminal Pb2 of the amplification element P2 and the output terminal Pb4 of the amplification element P4 are connected to the terminal N12, which is a second terminal of the primary coil L11.

Furthermore, a power supply voltage Vcc2 is supplied to a terminal N15, which is a third terminal of the primary coil L11. The terminal N15 is a different terminal from the first terminal and the second terminal of the primary coil L11, specifically, is a center point of the primary coil L11. In addition, the terminal N15 is connected to ground via the capacitor C2.

The capacitor C2 is an example of a second capacitance element and is connected to the terminal N15 and ground. The capacitor C2 is provided in order to help prevent a situation in which a radio-frequency signal input to the transformer T1 flows into the power supply voltage Vcc2.

A terminal N13 of the secondary coil L12 is connected to the output terminal Pout of the power amplification circuit 10. A terminal N14 of the secondary coil L12 is connected to ground.

As described above, the differential Doherty-type power amplification circuit 10 includes the transformer T1 and so on, and has a large number of circuit elements. Therefore, when the circuit components included in the radio-frequency module 1 including the power amplification circuit 10 is mounted on a single module substrate, the radio-frequency module 1 is increased in size. Regarding this, in the case of the radio-frequency module 1 according to this embodiment, a reduction in the size of the radio-frequency module 1 is realized by improving the arrangement of the components.
1-2. Arrangement of Components Hereafter, the arrangement of the components of the radio-frequency module 1 will be described using FIGS. 3A to 3C and FIG. 4.

Figure 3A:
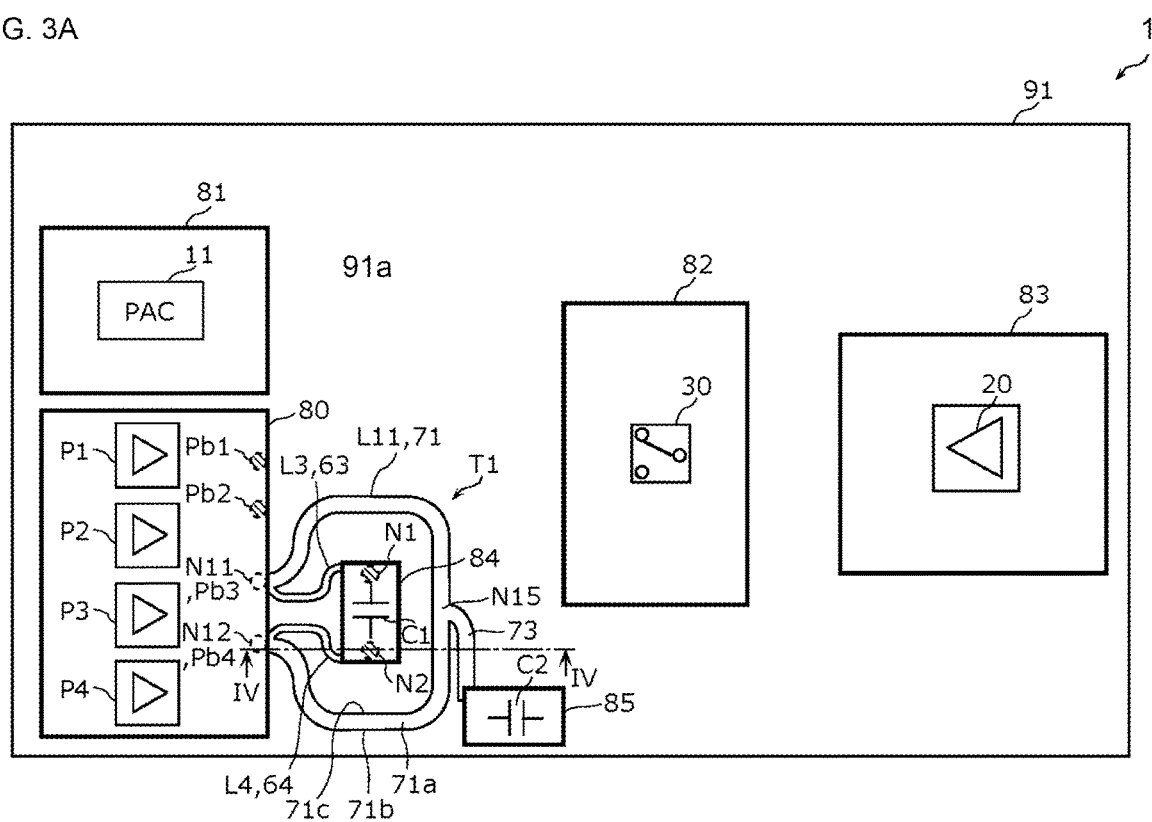
FIG. 3A is a plan view illustrating the layout of a main surface of a module substrate of the radio-frequency module according to Embodiment 1.
Figure 3B:
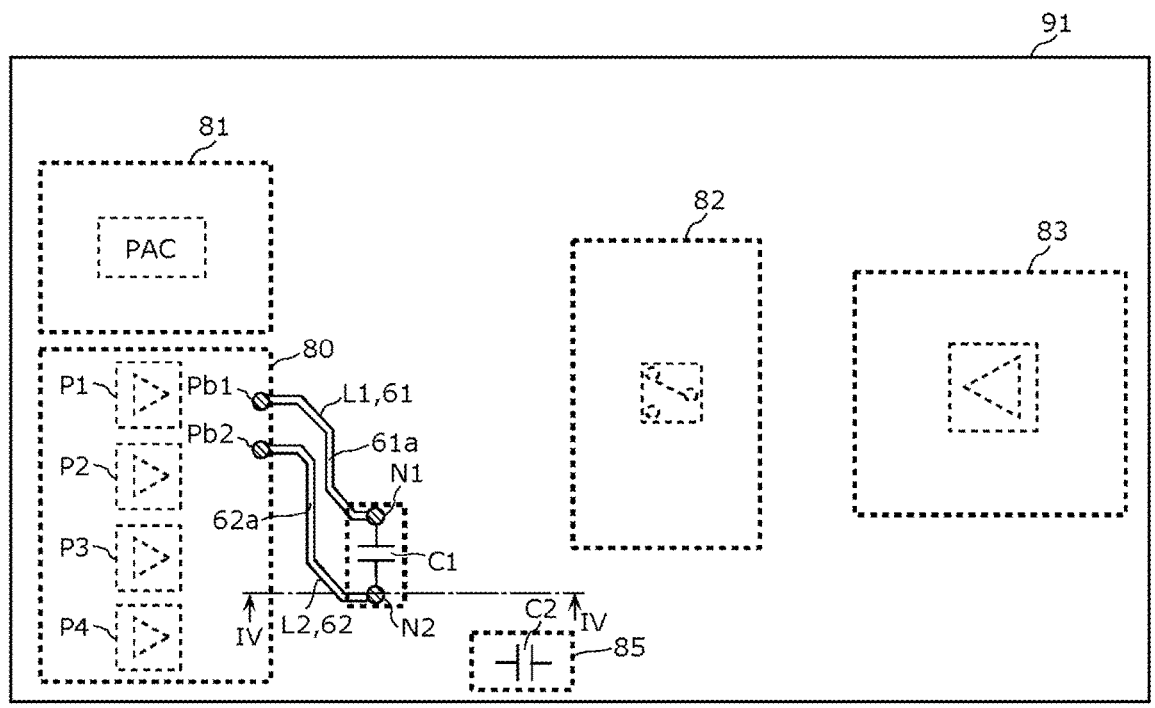
FIG. 3B is a plan view illustrating the layout of a first intermediate layer inside the module substrate of the radio-frequency module according to Embodiment 1.
Figure 3C:
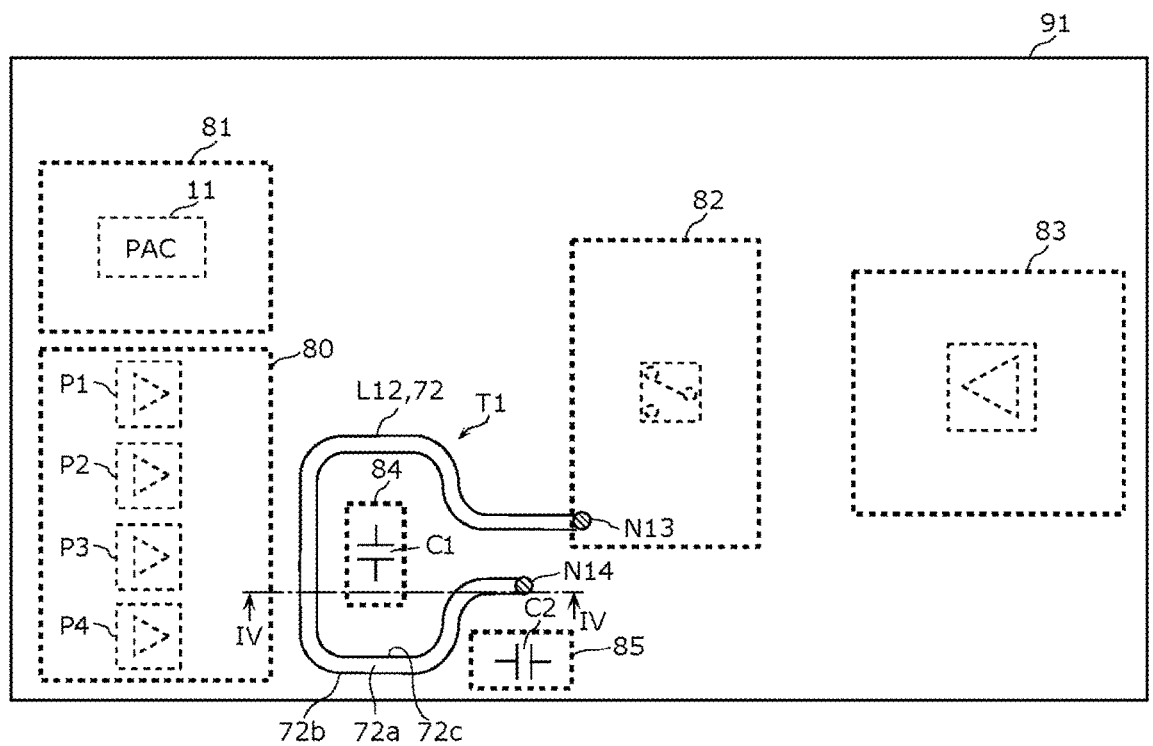
FIG. 3C is a plan view illustrating the layout of a second intermediate layer inside the module substrate of the radio-frequency module according to Embodiment 1.
Figure 4:
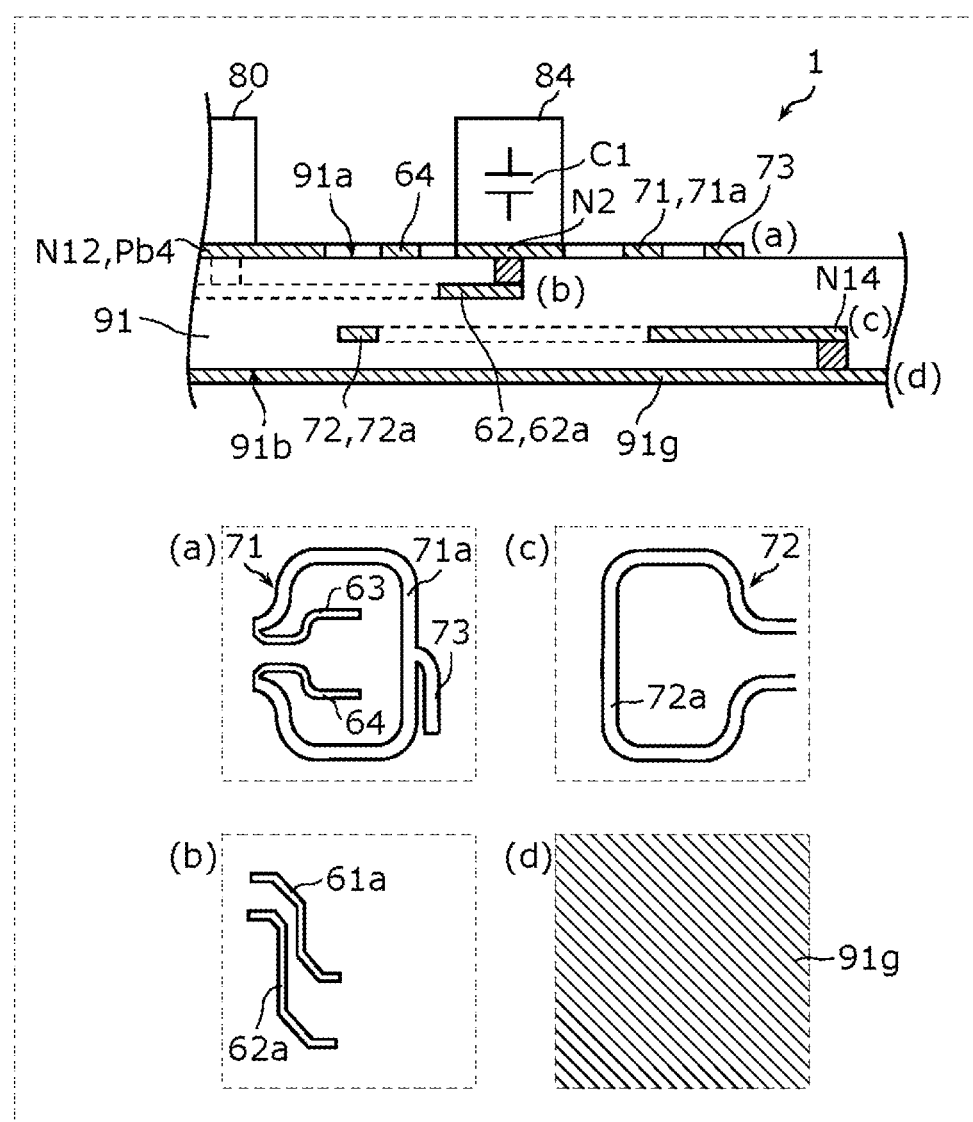
FIG. 4 is a diagram illustrating a cross section and main wiring lines of the radio-frequency module according to Embodiment 1.

FIGS. 3A to 3C are plan views illustrating the layouts of a main surface 91a, a first intermediate layer, and a second intermediate layer of a module substrate 91 of the radio-frequency module 1, respectively. FIG. 4 is a diagram illustrating a cross section and main wiring lines of the radio-frequency module 1 according to this embodiment. Specifically, FIG. 4 illustrates a cross section taken along a line IV-IV illustrated in FIGS. 3A to 3C. Parts (a) to (d) of FIG. 4 respectively illustrate regions that completely overlap in plan view and illustrate conductive layers, which are near the transformer T1, of the main surface 91a, the first intermediate layer, the second intermediate layer, and a main surface 91b of the module substrate 91.

As illustrated in the figures, the radio-frequency module 1 includes the module substrate 91. In addition, although not illustrated, the radio-frequency module 1 may be provided with a resin member that covers components disposed on a main surface of the module substrate 91 and external connection terminals that are used to electrically connect the module substrate 91 and another member (for example, a mother substrate) to each other.

As illustrated in FIG. 4, the module substrate 91 has the main surfaces 91a and 91b. The main surface 91a is also called a front surface or an upper surface. The main surface 91b is also called a lower surface or a rear surface. For example, a low-temperature co-fired ceramic (LTCC) substrate, a high-temperature co-fired ceramic (HTCC) substrate, a built-in-component substrate, a substrate having a redistribution layer (RDL), or a printed substrate having a multilayer structure consisting of a plurality of dielectric layers is used as the module substrate 91.

As illustrated in FIG. 3A, the radio-frequency module 1 includes a plurality of circuit components 80 to 85 disposed on the main surface 91a. The plurality of circuit components 80 to 85 include circuit elements included in the radio-frequency module 1. The circuit components 80 to 85 are surface mount devices (SMDs). Specifically, the circuit components 80 to 85 are integrated circuits (ICs), integrated passive devices (IPDs), or individual passive components such as chip inductors or chip capacitors. For example, the circuit component 80 includes amplification elements P1 to P4. The circuit component 81 includes a PA control circuit 11. The circuit component 82 includes the switch 30. The circuit component 83 includes the low-noise amplifier 20. The circuit component 84 includes the capacitor C1. The circuit component 85 includes the capacitor C2. Specifically, the circuit component 84 is a chip capacitor that includes the capacitor C1. The circuit component 85 is a chip capacitor that includes the capacitor C2.

Although not illustrated in FIG. 3A, a transmission filter and/or a reception filter, or inductors, capacitors and so on included in impedance matching networks and so forth are disposed on the main surface 91a. In addition, at least one of the circuit components may be disposed on the main surface 91b. In other words, the radio-frequency module 1 may be a module in which all of the circuit components are mounted on the main surface 91a of the module substrate 91 (one surface mounted) or may be a module in which the circuit components are separately mounted on the main surfaces 91a and 91b (two surface mounted).
1-2-1. Transformer Next, the arrangement and shape of the transformer T1 provided on and in the module substrate 91 will be described.

The primary coil L11 and the secondary coil L12 of the transformer T1 and the inductors L1 to L4 include conductive layers provided on the main surface 91a or inside the module substrate 91. The conductive layers are formed using a metal material such as copper and are wiring layers patterned into prescribed shapes.

As illustrated in FIG. 3A, the primary coil L11 includes a conductive layer 71. The conductive layer 71 is an example of a first conductive layer provided on or in the module substrate 91. In this embodiment, the conductive layer 71 is provided on the main surface 91a.

The two ends of the conductive layer 71 form the terminals N11 and N12. Therefore, the terminals N11 and N12 are also provided on the main surface 91a. As illustrated in FIG. 3A, the terminals N11 and N12 overlap the circuit component 80 in plan view. Specifically, the terminals N11 and N12 are respectively electrically connected to two electrode terminals of the circuit component 80. The circuit component 80 is an example of a second circuit component that includes the amplification elements P3 and P4 of the peak amplifier 14. The two electrode terminals of the circuit component 80 are the output terminal Pb3 of the amplification element P3 and the output terminal Pb4 of the amplification element P4 of the peak amplifier 14.

The conductive layer 71 includes a curved part 71a. The curved part 71a is an example of a first curved part that surrounds at least part of the circuit component 84 in plan view. The curved part 71a is shaped in plan view so as to surround three sides of the substantially rectangular circuit component 84, but the curved part 71a is not limited to this shape. The curved part 71a may instead surround only two sides of the circuit component 84.

The curved part 71a has a substantially annular shape in plan view. Note that "annular shape" refers to not only to an annular shape that extends through a complete revolution but also to an annular shape that is partially open. For example, as illustrated in FIG. 3A, the curved part 71a has a shape that follows the outline of a rounded-corner rectangle and is partially open. The curved part 71a includes straight parts and curved parts, but is not limited to this configuration. The curved part 71a may entirely consist of curved parts. Alternatively, instead of the curved part 71a, a bent part including a sharply bent part bent at a prescribed angle may be provided. The prescribed angle may be 90°, an acute angle, or an obtuse angle. These points also apply to a curved part 72a described later.

As illustrated in FIG. 3C, the secondary coil L12 includes a conductive layer 72. The conductive layer 72 is an example of a second conductive layer provided on a different layer from the first conductive layer in the module substrate 91. In this embodiment, the conductive layer 72 is provided inside the module substrate 91.

The two ends of the conductive layer 72 form the terminals N13 and N14. As illustrated in FIG. 3C, the terminal N13, for example, overlaps the circuit component 82, which includes the switch 30, and is connected to the circuit component 82 through a via. The terminal N14 is connected to a ground pattern 91g (refer to part (d) of FIG. 4) through a via.

The conductive layer 72 includes a curved part 72a. The curved part 72a is an example of a second curved part that surrounds at least part of the circuit component 84 in plan view. The curved part 72a is shaped in plan view so as to surround three sides of the substantially rectangular circuit component 84, but the curved part 72a is not limited to this shape. The curved part 72a may instead surround only two sides of the circuit component 84.

The curved part 72a has a substantially annular shape in plan view. The curved part 72a has a shape that follows the outline of a rounded-corner rectangle and is partially open. The open part of the curved part 72a is provided at a position so as to not overlap the open part of the curved part 71a in plan view, but may instead overlap the open part of the curved part 71a in plan view.

1-2-2. Circuit Components Near Transformer

In this embodiment, the circuit component 84 is an example of a first component and is not disposed outside the curved part 71a in plan view. Note that "A is not disposed outside B" means a certain part of A is located inside an outer-peripheral-side outline of B. Here, part of A may overlap B. A specific example in which there is an overlapping part will be described later using FIG. 7.

As illustrated in FIG. 3A, the circuit component 84 is disposed inside an outer-peripheral-side outline 71b of the curved part 71a in plan view. For example, the circuit component 84 is disposed inside the curved part 71a in plan view. Specifically, the circuit component 84 is disposed inside an inner-peripheral-side outline 71c of the curved part 71a in plan view. In other words, the circuit component 84 is disposed so as to not overlap and be at a prescribed distance from the curved part 71a in plan view.

In addition, the circuit component 84 is not disposed outside the curved part 72a of the conductive layer 72. In other words, the circuit component 84 is disposed inside an outer-peripheral-side outline 72b of the curved part 72a of the conductive layer 72 in plan view. For example, the circuit component 84 is disposed inside the curved part 72a in plan view. Specifically, the circuit component 84 is disposed inside an inner-peripheral-side outline 72c of the curved part 72a in plan view. In other words, the circuit component 84 is disposed so as to not overlap and be at a prescribed distance from the curved part 72a in plan view.

Thus, the circuit component 84 is provided at the center of the transformer T1 and is surrounded by both the primary coil L11 (conductive layer 71) and the secondary coil L12 (conductive layer 72) in plan view. In other words, the region at the center of the transformer T1 can be effectively utilized for arrangement of a component and this can contribute to reducing the size of the radio-frequency module 1.

In addition, in this embodiment, the primary coil L11 and the capacitor C2 can be easily connected to each other due to the primary coil L11 being disposed on the main surface 91a of the module substrate 91. Specifically, as illustrated in FIG. 3A, a conductive layer 73 is provided that extends from the terminal N15, which corresponds to a center point of the conductive layer 71, to the circuit component 85, which includes the capacitor C2. The conductive layer 73 is provided on the main surface 91a.

1-2-3. Wiring Lines Forming Inductors

In this embodiment, the arrangement and the inductance value of the inductors L1 to L4 connected to the capacitor C1 can be easily adjusted due to the circuit component 84 including the capacitor C1. In a differential Doherty amplification circuit, the inductance values of the inductors L1 and L2 can be equal to each other and that the inductance values of the inductors L3 and L4 can be equal to each other. In this embodiment, these inductance values are adjusted using wiring lines 61 to 64 provided on or in the module substrate 91. In other words, the inductors L1 to L4 are formed of inductor components of the wiring lines 61 to 64. Hereafter, a specific configuration of the wiring lines 61 to 64 will be described using FIGS. 3A, 3B, and 4.

The wiring line 61 and the wiring line 63 are included in the first wiring line path connected between the output terminal Pb1 of the amplification element P1 and the terminal N11 of the primary coil L11 of the transformer T1. The wiring line 62 and the wiring line 64 are included in the second wiring line path connected between the output terminal Pb2 of the amplification element P2 and the terminal N12 of the primary coil L11 of the transformer T1.

The wiring line 61 is an example of a first wiring line that is connected between the output terminal Pb1 of the amplification element P1 and the node N1, and forms the inductor L1. The wiring line 62 is an example of a second wiring line that is connected between the output terminal Pb2 of the amplification element P2 and the node N2, and forms the inductor L2. The wiring line 63 is an example of a third wiring line that is connected between the node N1 and the terminal N11 of the primary coil L11, and forms the inductor L3. The wiring line 64 is an example of a fourth wiring line that is connected between the node N2 and the terminal N12 of the primary coil L11, and forms the inductor L4. The nodes N1 and N2 respectively correspond to electrode terminals of the circuit component 84 including the capacitor C1.

At least part of each of the wiring lines 61 and 62 is provided in a different layer from the conductive layer 71 in the module substrate 91. "Different layers" refers to layers that are at different heights from the main surface 91a (or main surface 91b). Specifically, as illustrated in FIGS. 3B and 4, the wiring lines 61 and 62 are provided between the main surface 91a of the module substrate 91 and the secondary coil L12 (conductive layer 72) of the transformer T1.

As illustrated in FIG. 3B, the wiring lines 61 and 62 respectively include conductive layers 61a and 62a. The conductive layers 61a and 62a extend parallel to the main surface 91a between the conductive layer 71 (primary coil L11) provided on the main surface 91a of the module substrate 91 and the conductive layer 72 (secondary coil L12) provided inside the module substrate 91 (second intermediate layer). Furthermore, the wiring line 61 includes a via connected between one end of the conductive layer 61a and the output terminal Pb1 and a via connected between the other end of the conductive layer 61a and the node N1, which is an electrode terminal of the circuit component 84. The wiring line 62 includes a via connected between one end of the conductive layer 62a and the output terminal Pb2 and a via connected between the other end of the conductive layer 62a and the node N2, which is an electrode terminal of the circuit component 84. The vias have the same height. In addition, as illustrated in FIG. 3B, the lengths of the two conductive layers 61a and 62a can be made equal to each other. Specifically, in plan view, a line segment connecting the nodes N1 and N2 and a line segment connecting the output terminals Pb1 and Pb2 are disposed so as to have the same length and be parallel to each other, and as a result the lengths of the two conductive layers 61a and 62a can be made equal to each other.

Thus, the wiring line length of the wiring line 61 and the wiring line length of the wiring line 62 can be made equal to each other. The inductance value of the wiring line 61 and the inductance value of the wiring line 62 are equal to each other as a result of the diameter of the vias and the width of the conductive layers having been made identical to each other. In other words, the inductance value of the inductor L1 is equal to the inductance value of the inductor L2.

Furthermore, the wiring lines 63 and 64 are provided in the same layer as the conductive layer 71 in the module substrate 91. Specifically, the wiring lines 63 and 64 are provided on the main surface 91a of the module substrate 91.

As illustrated in FIG. 3A, the wiring lines 63 and 64 are conductive layers that extend along the main surface 91a, similarly to the conductive layer 71. The wiring lines 63 and 64 are axisymmetrically provided with respect to an imaginary common axis. Specifically, the wiring lines 63 and 64 have axisymmetrical shapes and are axisymmetrically disposed with respect to a perpendicular bisector of a line segment connecting the terminals N11 and N12 serving as an axis. Similarly, the circuit component 84 and the conductive layer 71 (curved part 71a) are axisymmetrically provided with respect to a perpendicular bisector of a line segment connecting the terminals N11 and N12 serving as an axis.

Thus, the wiring line length of the wiring line 63 and the wiring line length of the wiring line 64 can be easily made equal to each other. The inductance value of the wiring line 63 and the inductance value of the wiring line 64 are equal to each other due to the width of the wiring line 63 and the width of the wiring line 64 being equal to each other. In other words, the inductance value of the inductor L3 is equal to the inductance value of the inductor L4.

1-2-4. Ground Pattern

As illustrated in FIG. 4, the radio-frequency module 1 includes the ground pattern 91g provided on the module substrate 91. The ground pattern 91g overlaps the entire transformer T1 in plan view. Specifically, the ground pattern 91g overlaps the primary coil L11 and the secondary coil L12 in plan view. In addition, the ground pattern 91g overlaps a region surrounded by the curved part 71a of the conductive layer 71 included in the primary coil L11 and a region surrounded by the curved part 72a of the conductive layer 72 included in the secondary coil L12. In other words, the ground pattern 91g overlaps the circuit component 84 in plan view.

The ground pattern 91g is, for example, provided on the main surface 91b of the module substrate 91, but is not limited to this arrangement. The ground pattern 91g may be provided in a third intermediate layer located between the conductive layer 72 and the main surface 91b inside the module substrate 91.

Furthermore, the radio-frequency module 1 does not have to include the ground pattern 91g. In this case, the conductive layer 72 (secondary coil L12) of the transformer T1 may be provided on the main surface 91b of the module substrate 91.

1-3 Effects and so Forth

As described above, the radio-frequency module 1 according to this embodiment includes the module substrate 91 and the power amplification circuit 10 disposed on and in the module substrate 91. The power amplification circuit 10 includes the amplification elements P1 to P4, the transformer T1 including the primary coil L11 and the secondary coil L12, the output terminal Pout to which one end of the secondary coil L12 is connected, and the circuit component 84 that is disposed on the main surface 91a of the module substrate 91. The output terminal Pb1 of the amplification element P1 and the output terminal Pb3 of the amplification element P3 are connected to the terminal N11 of the primary coil L11. The output terminal Pb2 of the amplification element P2 and the output terminal Pb4 of the amplification element P4 are connected to the terminal N12 of the primary coil L11. The capacitor C1 is connected to the first wiring line path connected between the output terminal Pb1 of the amplification element P1 and the terminal N11 and to the second wiring line path connected between the output terminal Pb2 of the amplification element P2 and the terminal N12. The primary coil L11 includes the conductive layer 71 provided on the module substrate 91. The conductive layer 71 surrounds at least part of the circuit component 84 when the module substrate 91 is viewed in plan view. For example, the part that surrounds at least part of the circuit component 84 is the curved part 71a.

Thus, the region inside the curved part 71a can be effectively used as a region in which to mount the circuit component 84. Therefore, this can contribute to reducing the size of the radio-frequency module 1.

Furthermore, for example, the circuit component 84 is not disposed outside the curved part 71*a* in plan view. In addition, for example, the circuit component 84 is disposed inside the curved part 71*a* in plan view.

Thus, the circuit component 84 and the curved part 71*a* are not electrically connected to each other, and this enables elements that can be included in the circuit component 84 to be selected with a high degree of freedom. For example, it is possible to include an element in the circuit component 84 that enables the wiring length of the wiring lines connected to the circuit component 84 to be shortened, and therefore this contributes to reducing the size of the radio-frequency module 1.

In addition, for example, the secondary coil L12 includes the conductive layer 72 provided in a different layer from the conductive layer 71 in the module substrate 91. The conductive layer 72 surrounds at least part of the circuit component 84 in plan view. For example, the part that surrounds at least part of the circuit component 84 is the curved part 72*a*. In addition, for example, the circuit component 84 is disposed inside the outer-peripheral-side outline 72*b* of the curved part 72*a* in plan view.

Thus, the primary coil L11 and the secondary coil L12 are disposed so as to overlap in plan view, and therefore the transformer T1 can be reduced in size. Therefore, this can contribute to reducing the size of the radio-frequency module 1.

Furthermore, for example, the circuit component 84 includes the capacitor C1.

Thus, because the capacitor C1 of the phase conversion circuit 15 is included in the circuit component 84, it is easy to secure symmetry for the connection between the capacitor C1 and the primary coil L11 of the transformer T1 and the symmetry for the connection between the amplification elements P1 and P2. Furthermore, for example, the circuit component 84 is a chip capacitor. Specifically, the circuit component 84 is a chip capacitor that includes the capacitor C1. Thus, the frequency characteristics of the capacitor C1 can be improved.

In addition, for example, the first wiring line path includes the wiring line 61, which is connected between the output terminal Pb1 of the amplification element P1 and the node N1, and the wiring line 63, which is connected between the node N1 and the terminal N11. The second wiring line path includes the wiring line 62, which is connected between the output terminal Pb2 of the amplification element P2 and the node N2, and the wiring line 64, which is connected between the node N2 and the terminal N12.

Thus, the inductors L1 to L4 of the phase conversion circuit 15 can be formed of the wiring lines 61 to 64. In the differential Doherty-type power amplification circuit 10, a relationship is required in which the inductance values of the inductors L1 and L2 included in the phase conversion circuit 15 are equal to each other and the inductance values of the inductors L3 and L4 included in the phase conversion circuit 15 are equal to each other. The inductance values of the inductors L1 to L4 can be easily made to have a desired relationship by adjusting the wiring line lengths and/or widths of the wiring lines 61 to 64.

In addition, for example, the wiring line length of the wiring line 61 is equal to the wiring line length of the wiring line 62.

Thus, the inductance values of the inductors L1 and L2 can be made equal to each other by making the widths of the wiring lines 61 and 62 equal to each other.

Furthermore, for example, at least part of each of the wiring lines 61 and 62 is provided in a different layer from the conductive layer 71 in the module substrate 91.

Thus, desired circuit connections can be realized while avoiding short circuits with the primary coil L11. Furthermore, by providing parts of the wiring lines 61 and 62 (specifically, the conductive layers 61*a* and 62*a*) in the same layer, the heights of vias connected to the conductive layers 61*a* and 62*a* can be made identical and the wiring line lengths of the wiring lines 61 and 62 can be easily made equal to each other.

In addition, for example, the wiring line length of the wiring line 63 is equal to the wiring line length of the wiring line 64.

Thus, the inductance values of the inductors L3 and L4 can be made equal to each other by making the widths of the wiring lines 63 and 64 equal to each other.

In addition, for example, the wiring lines 63 and 64 are provided on the main surface 91*a*.

As a result, redundant routing of wiring lines can be avoided and the generation of unwanted parasitic inductances and/or parasitic capacitances can be suppressed. Furthermore, the wiring lines 63 and 64 can be formed in the same layer as the primary coil L11, and therefore the number of intermediate layers located between the primary coil L11 and the secondary coil L12 can be reduced. As a result, the primary coil L11 and the secondary coil L12 can be brought closer to each other, and therefore electromagnetic coupling between the coils can be strengthened and power loss in the transformer T1 can be reduced.

In addition, for example, the circuit component 84 and the wiring lines 63 and 64 are axisymmetrically provided with respect to an imaginary common axis.

Thus, the wiring line lengths of the wiring lines 63 and 64 can be easily made equal to each other and the inductance values of the inductors L3 and L4 can be made equal to each other.

Furthermore, for example, the conductive layer 71 and the terminals N11 and N12 are provided on the main surface 91*a*.

Thus, an electrical connection between the circuit component 84 and the primary coil L11 can be formed on the main surface 91*a*. Redundant routing of wiring lines can be avoided and the generation of unwanted parasitic inductances and/or parasitic capacitances can be suppressed.

Furthermore, for example, the amplification elements P3 and P4 are included in the circuit component 80, which is disposed on the main surface 91*a*. The circuit component 80 overlaps the terminals N11 and N12 in plan view.

Thus, electrical connections between the primary coil L11 and the amplification elements P3 and P4 can be made on the main surface 91*a*. Redundant routing of wiring lines can be avoided and the generation of unwanted parasitic inductances and/or parasitic capacitances can be suppressed.

Furthermore, for example, the circuit component 84 and the conductive layer 71 are axisymmetrically provided with respect to an imaginary common axis.

This makes it easier to design the layouts of wiring lines. Therefore, redundant routing of wiring lines can be avoided and the generation of unwanted parasitic inductances and/or parasitic capacitances can be suppressed.

Furthermore, for example, the radio-frequency module 1 further includes the ground pattern 91*g* that is provided on the module substrate 91 and that overlaps the entire transformer T1 in plan view.

Thus, the capacitor C2 and a terminal N22 of the secondary coil L12 can be easily connected to ground while realizing a shielding function with the ground pattern 91g.

In addition, for example, first radio-frequency signals having the same amplitude and opposite phases are respectively input to the amplification elements P1 and P2 and second radio-frequency signals having the same amplitude and opposite phases are respectively input to the amplification elements P3 and P4. In addition, for example, the first radio-frequency signals are signals that are split from the input signal when the power level of the input signal input to the power amplification circuit 10 is greater than or equal to the first level. The second radio-frequency signals are signals that are split from the input signal when the power level of the input signal is greater than or equal to the second level, which is higher than the first level, and are signals whose phases are shifted from those of the first radio-frequency signals.

Thus, the differential Doherty-type power amplification circuit 10 can be realized. Higher power amplification is possible and power saving can be ensured at times of low power.

Furthermore, the communication device 5 according to this embodiment includes the RFIC 3 that processes radio-frequency signals transmitted and received by the antenna 2 and the radio-frequency module 1 that transmits radio-frequency signals between the RFIC 3 and the antenna 2.

Thus, the communication device 5 can be reduced in size as the radio-frequency module 1 is reduced in size.

1-4. Modifications

Next, modifications of above-described Embodiment 1 will be described. In the following description, the description focuses on the differences from Embodiment 1 and description of common points is omitted or simplified.

1-4-1. Modification 1

First, Modification 1 will be described.

In Embodiment 1, an example is illustrated in which the circuit component 80 and the terminals N11 and N12 overlap in plan view, but the present disclosure is not limited to this configuration. In Modification 1, as illustrated in FIG. 5, the circuit component 80 and the terminals N11 and N12 do not overlap in plan view and are disposed with a prescribed distance therebetween.

Figure 5:
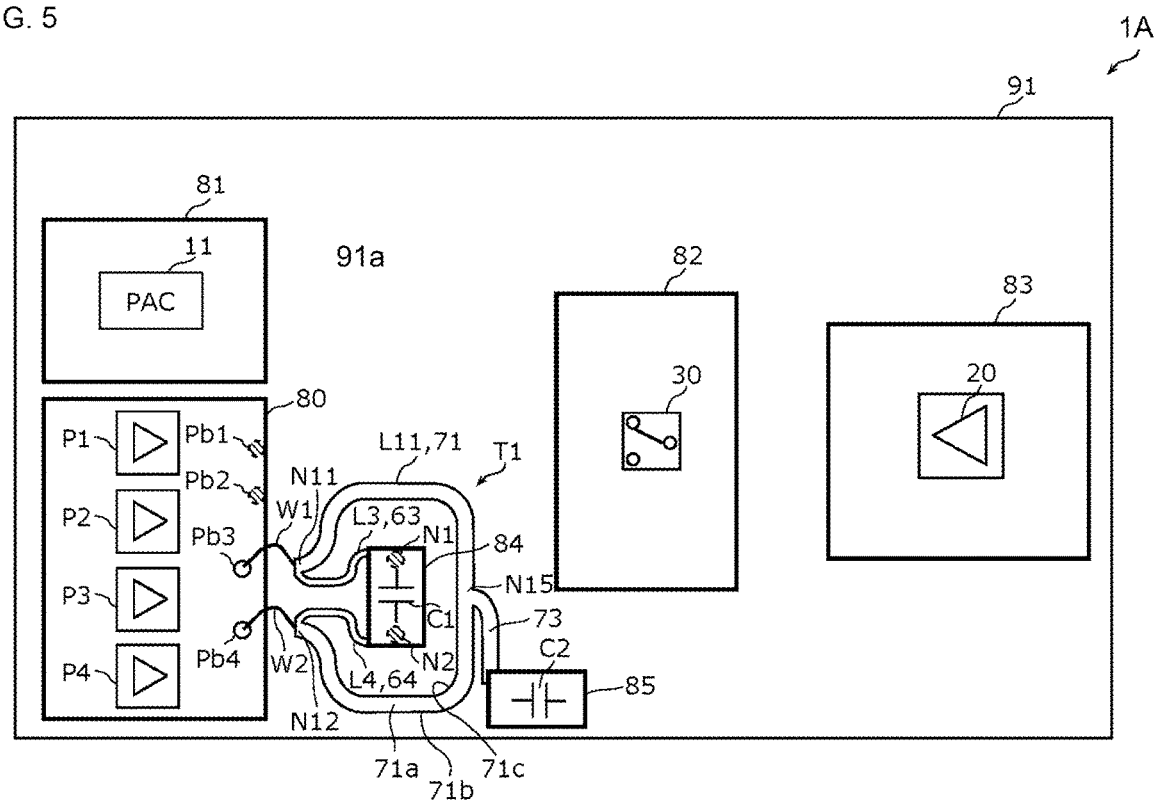
FIG. 5 is a plan view illustrating the layout of a main surface of a module substrate of a radio-frequency module according to Modification 1 of Embodiment 1.

FIG. 5 is a plan view illustrating the layout of the main surface 91a of the module substrate 91 of a radio-frequency module 1A according to Modification 1. In the radio-frequency module 1A, two electrode terminals (output terminals Pb3 and Pb4) of the circuit component 80 and the terminals N11 and N12 of the conductive layer 71 are connected to each other by two bonding wires W1 and W2. The bonding wires W1 and W2 are metal wires such as gold wires. The two electrode terminals of the circuit component 80 are, for example, provided on the top surface of the circuit component 80.

Thus, in the radio-frequency module 1A according to this modification, the amplification elements P3 and P4 are included in the circuit component 80 disposed on the main surface 91a. The circuit component 80 is connected via wire bonding to the terminals N11 and N12.

Thus, the area occupied by conductive layers provided on the main surface 91a can be reduced by utilizing the bonding wires W1 and W2. Therefore, this can contribute to reducing the size of the radio-frequency module 1A.

1-4-2. Modifications 2 and 3

Next, Modifications 2 and 3 will be described.

In Embodiment 1 and Modification 1, examples are illustrated in which the circuit component 84, which includes the capacitor C1, is disposed at the center of the transformer T1, but the present disclosure is not limited to this configuration. In Modifications 2 and 3, as illustrated in FIGS. 6 and 7, the circuit component 85, which includes the capacitor C2, is disposed at the center of the transformer T1.

Figure 6:
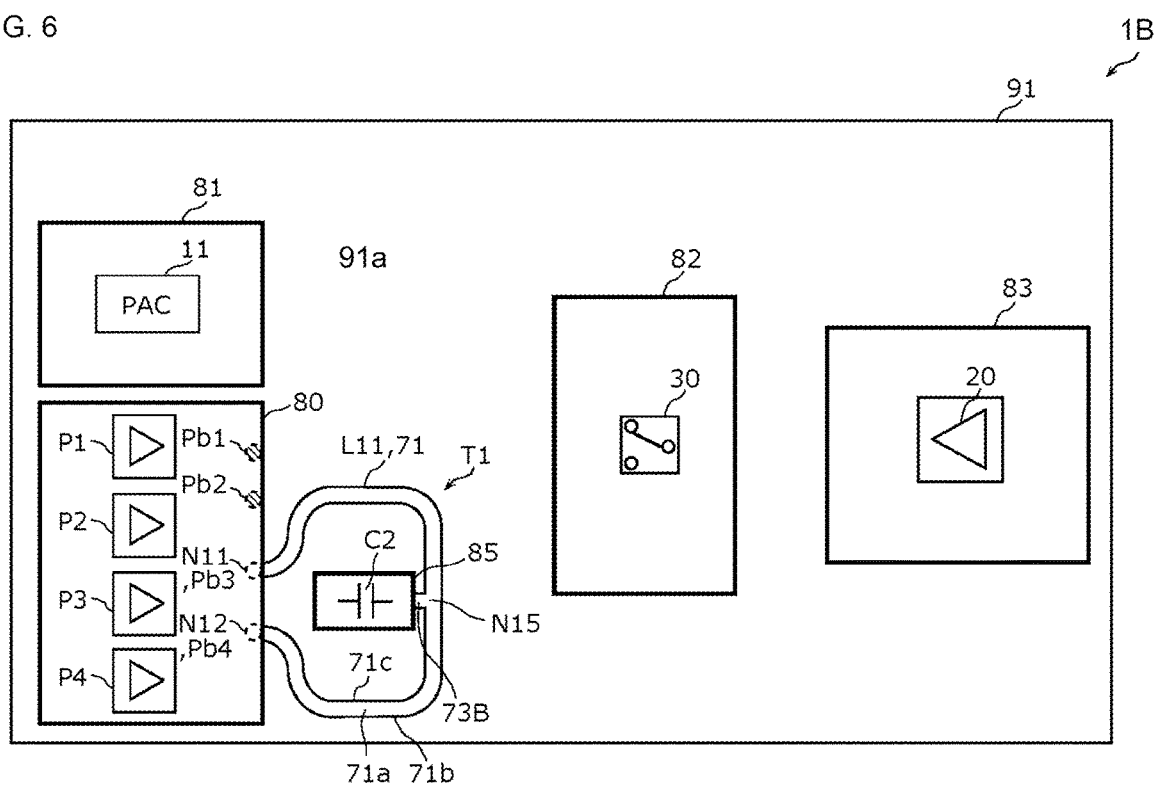
FIG. 6 is a plan view illustrating the layout of a main surface of a module substrate of a radio-frequency module according to Modification 2 of Embodiment 1.

FIG. 6 is a plan view illustrating the layout of the main surface 91a of the module substrate 91 of a radio-frequency module 1B according to Modification 2. In the radio-frequency module 1B, the circuit component 85, rather than the circuit component 84, is disposed so as to be surrounded by the curved part 71a of the conductive layer 71. Although not illustrated, the same applies to the curved part 72a of the conductive layer 72. In other words, the circuit component 85 is disposed inside the inner-peripheral-side outline 71c of the curved part 71a of the conductive layer 71 and inside the inner-peripheral-side outline 72c of the curved part 72a of the conductive layer 72 in plan view.

The circuit component 85 includes the capacitor C2 and is therefore electrically connected to the terminal N15, which is the center point of the primary coil L11 (conductive layer 71). Specifically, a conductive layer 73B that extends inwardly from the terminal N15 is provided on the main surface 91a of the module substrate 91. In the example illustrated in FIG. 6, the conductive layer 73B, the circuit component 85, and the conductive layer 71 are axisymmetrically provided with respect to an imaginary axis in plan view. The common axis corresponds to a virtual line that passes through the terminal N15 and coincides with a direction in which the conductive layer 73B extends.

Figure 7:
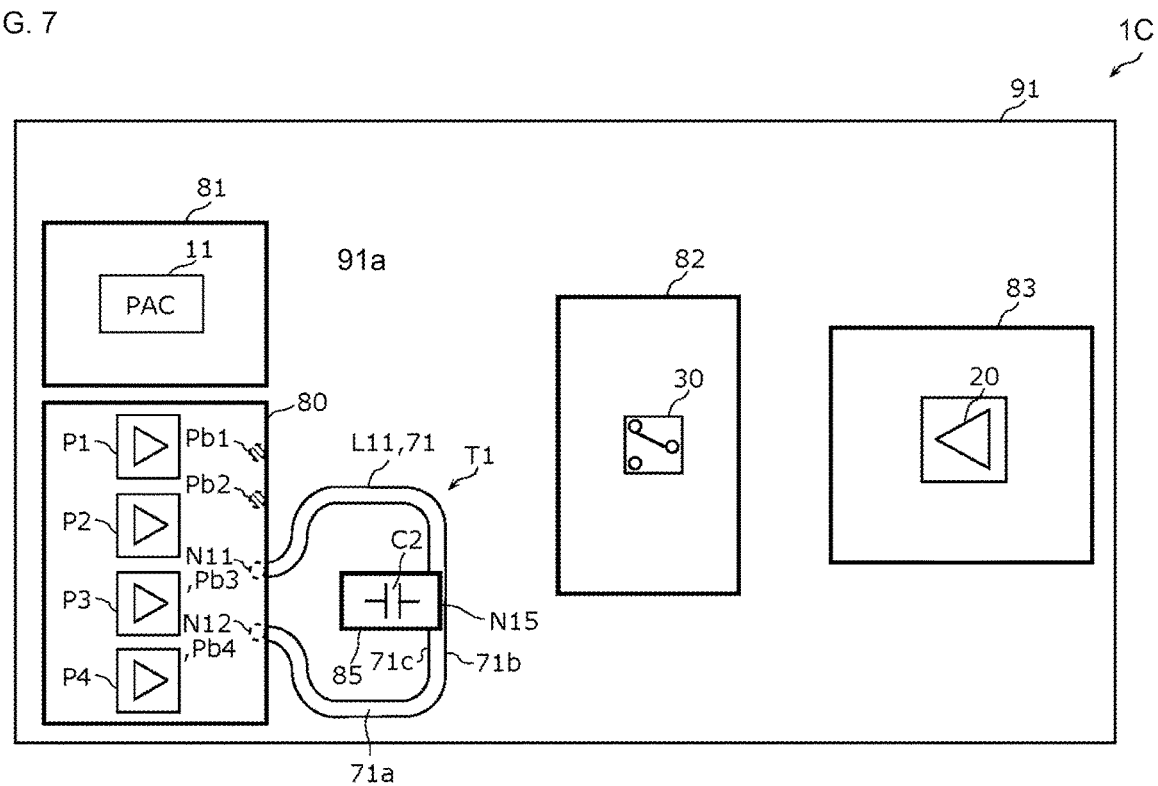
FIG. 7 is a plan view illustrating the layout of a main surface of a module substrate of a radio-frequency module according to Modification 3 of Embodiment 1.

As illustrated in FIG. 7, the conductive layer 73B does not have to be provided. FIG. 7 is a plan view illustrating the layout of the main surface 91a of the module substrate 91 of a radio-frequency module 1C according to Modification 3.

In the radio-frequency module 1C, the circuit component 85 is not disposed outside the curved part 71a in plan view. In other words, the circuit component 85 does not overlap the outer-peripheral-side outline 71b of the curved part 71a and is disposed inside the outer-peripheral-side outline 71b in plan view. Specifically, as illustrated in FIG. 7, part of the circuit component 85 may overlap the conductive layer 71 (primary coil L11) of the transformer T1 in plan view. In this modification, the circuit component 85 overlaps the inner-peripheral-side outline 71c of the curved part 71a in plan view. Thus, the wiring line connecting the circuit component 85 and the primary coil L11 can be shortened, and therefore generation of unwanted parasitic inductances and/or parasitic capacitances can be suppressed.

As described above, in the radio-frequency module 1B or 1C, the primary coil L11 has the terminal N15, and the circuit component 85, which is surrounded by the curved part 71a, includes the capacitor C2 connected to the terminal N15 and ground.

Thus, similarly to Embodiment 1 described above, this contributes to reducing the size of the radio-frequency module 1B or 1C. Furthermore, for example, the circuit component 85 is a chip capacitor. Specifically, the circuit component 85 is a chip capacitor that includes the capacitor C2. Thus, the frequency characteristics of the capacitor C2 can be improved.

In FIGS. 6 and 7, illustration of the capacitor C1 is omitted. The capacitor C1 may, for example, be formed of conductive layers inside the module substrate 91. Alternatively, a circuit component including the capacitor C1 may be provided on the main surface 91a.

Embodiment 2

Next, Embodiment 2 will be described.

In Embodiment 2, the circuit configuration of the power amplification circuit differs from that in Embodiment 1. Hereafter, the description focuses on the differences from Embodiment 1 and description of common points is omitted or simplified.

2-1. Circuit Configuration of Power Amplification Circuit

Figure 8:
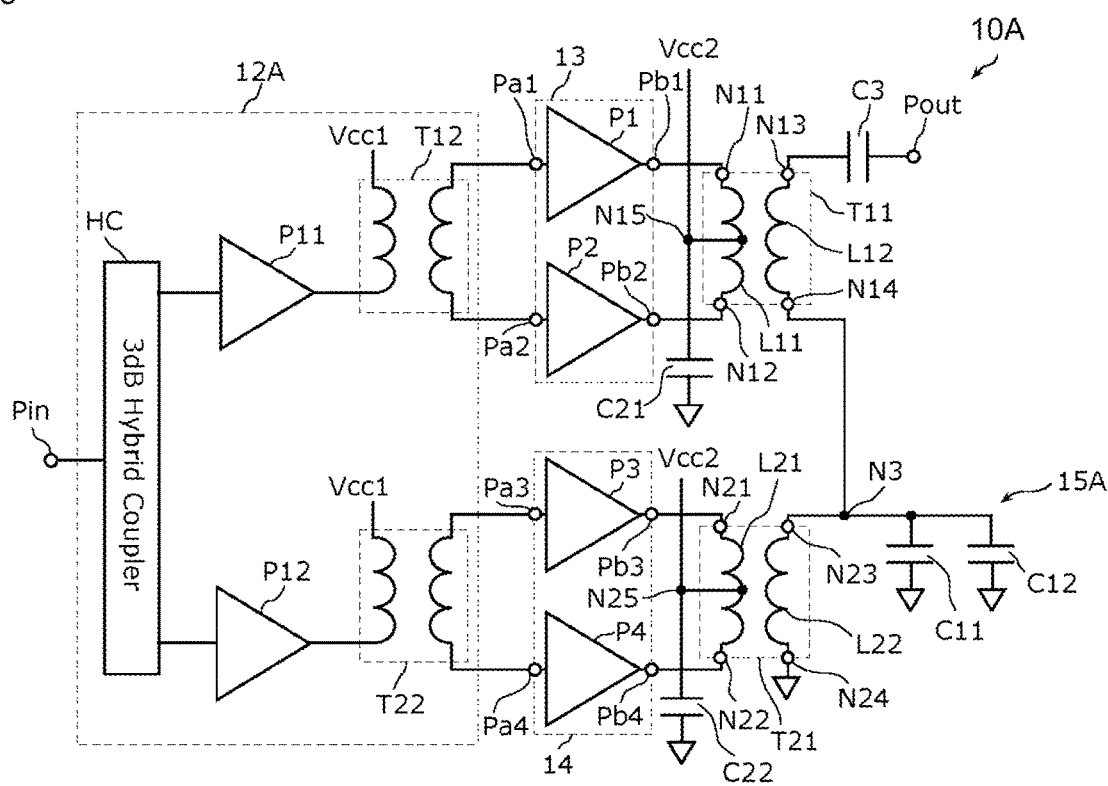
FIG. 8 is a circuit diagram of a power amplification circuit of a radio-frequency module according to Embodiment 2.

First, the circuit configuration of a power amplification circuit 10A according to this embodiment will be described using FIG. 8. FIG. 8 is a circuit diagram of the power amplification circuit 10A of the radio-frequency module according to this embodiment.

The power amplification circuit 10A differs from the power amplification circuit 10 according to Embodiment 1 in that the phase conversion circuit is provided on the secondary side rather than the primary side of the transformer. Specifically, as illustrated in FIG. 8, the power amplification circuit 10A includes an input terminal Pin and an output terminal Pout, a power splitter 12A, a carrier amplifier 13, a peak amplifier 14, a phase conversion circuit 15A, transformers T11 and T21, and capacitors C3, C21, and C22. The power amplification circuit 10A is a differential Doherty power amplification circuit.

The input terminal Pin, the output terminal Pout, the carrier amplifier 13, and the peak amplifier 14 are the same as those in Embodiment 1. In addition, the power splitter 12A is the same as the power splitter 12 illustrated in FIG. 2. In the power splitter 12A, the transformer T2 illustrated in FIG. 2 is illustrated as being divided into a transformer T12 and a transformer T22, but the transformer T2 and the transformers T12 and T22 have substantially the same configuration.

The transformer T11 is an example of a first transformer and includes the primary coil L11 and the secondary coil L12, which are electromagnetically coupled with each other. The transformer T11 conveys a signal amplified by the carrier amplifier 13 and input to the primary coil L11 to the secondary coil L12.

The primary coil L11 is an example of a first primary coil. The terminal N11, which is one end of the primary coil L11, is connected to the output terminal Pb1 of the amplification element P1. The terminal N12, which is the other end of the primary coil L11, is connected to the output terminal Pb2 of the amplification element P2. In addition, the power supply voltage Vcc2 is connected to the terminal N15 of the primary coil L11. In addition, the terminal N15 is connected to ground via the capacitor C21.

The capacitor C21 is an example of a second capacitance element and is connected to the terminal N15 and ground. The capacitor C21 is provided in order to help prevent a situation in which a radio-frequency signal input to the transformer T11 flows into the power supply voltage Vcc2.

The secondary coil L12 is an example of a first secondary coil. The terminal N13, which is one end of the secondary coil L12, is connected to the output terminal Pout of the power amplification circuit 10 via the capacitor C3. The capacitor C3 is a DC cut capacitor. The terminal N14, which is the other end of the secondary coil L12, is connected to a terminal N23 of a secondary coil L22 of the transformer T21.

The transformer T21 is an example of a second transformer and includes a primary coil L21 and a secondary coil L22, which are electromagnetically coupled with each other. The transformer T21 conveys a signal amplified by the peak amplifier 14 and input to the primary coil L21 to the secondary coil L22.

The primary coil L21 is an example of a second primary coil. A terminal N21, which is one end of the primary coil L21, is connected to the output terminal Pb3 of the amplification element P3. The terminal N22, which is the other end of the primary coil L21, is connected to the output terminal Pb4 of the amplification element P4. In addition, the power supply voltage Vcc2 is connected to a terminal N25 of the primary coil L21. In addition, the terminal N25 is connected to ground via the capacitor C22.

The capacitor C22 is an example of a second capacitance element and is connected to the terminal N25 and ground. The capacitor C22 is provided in order to help prevent a situation in which a radio-frequency signal input to the transformer T21 flows into the power supply voltage Vcc2.

The secondary coil L22 is an example of a second secondary coil. The terminal N23, which is one end of the secondary coil L22, is connected to terminal N14 of the secondary coil L12 of the transformer T11. A terminal N24, which is the other end of the secondary coil L22, is connected to ground.

Capacitors C11 and C12 are connected to a node N3 on a wiring line path connected between the terminal N14 of the secondary coil L12 and the terminal N23 of the secondary coil L22. The two capacitors C11 and C12 are connected in parallel with each other and are connected between the node N3 and ground. One out of the capacitors C11 and C12 does not have to be provided.

In this embodiment, the phase conversion circuit 15A is formed of the capacitors C11 and C12 and the secondary coils L12 and L22. The secondary coils L12 and L22 function as a transformer, but also contribute to a phase conversion function. The phase conversion circuit 15A is, for example, adjusted so as to shift the phase of a radio-frequency signal output from the peak amplifier 14 by a prescribed amount. Specifically, the phase conversion circuit 15A is adjusted so as to delay the phase of the radio-frequency signal output from the peak amplifier 14 by around λ/4 (around 90°).

As described above, the differential Doherty-type power amplification circuit 10A includes the transformers T11 and T12 and so on, and has a large number of circuit elements. Therefore, when the circuit components included in the radio-frequency module including the power amplification circuit 10A are mounted on a single module substrate, the radio-frequency module is increased in size. With respect to this, for the radio-frequency module according to this embodiment, a reduction in the size of the radio-frequency module is realized by improving the arrangement of the components.

2-2. Arrangement of Components

Hereafter, the arrangement of components of a radio-frequency module 1D including the power amplification circuit 10A illustrated in FIG. 8 will be described using FIGS. 9A and 9B.

Figure 9A:
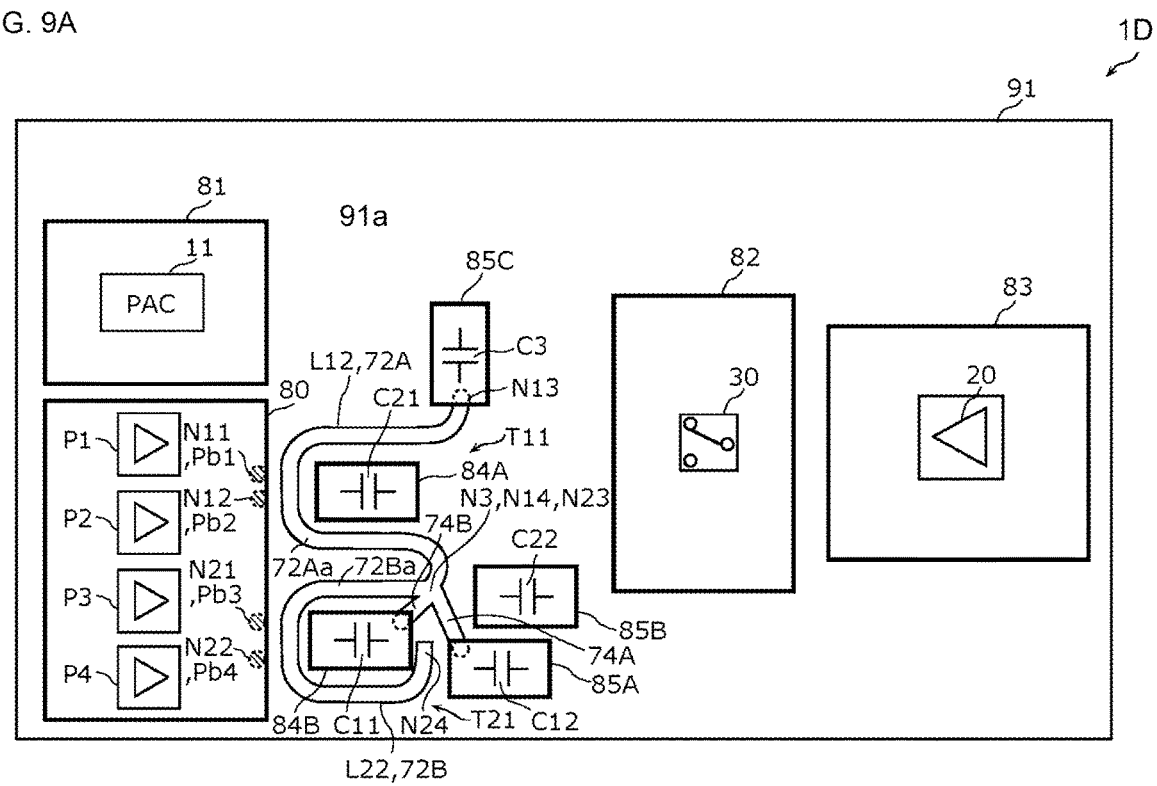
FIG. 9A is a plan view illustrating the layout of a main surface of a module substrate of the radio-frequency module according to Embodiment 2.
Figure 9B:
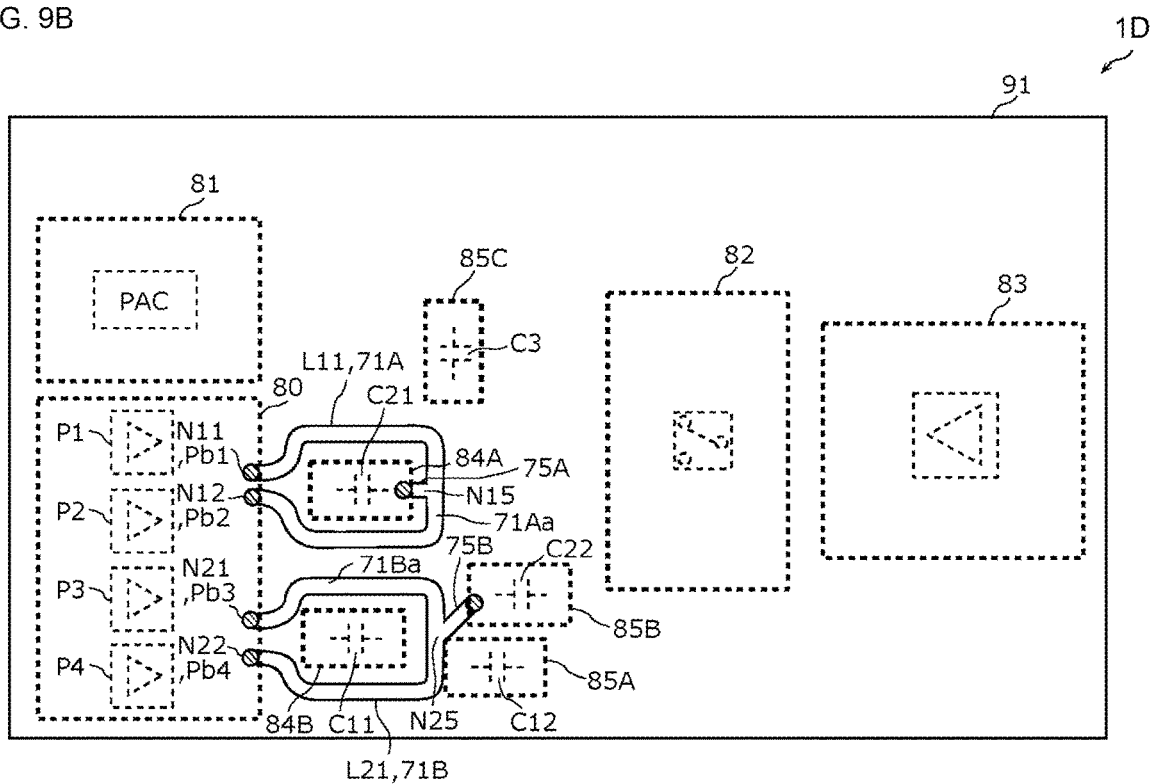
FIG. 9B is a plan view illustrating the layout of an intermediate layer of the module substrate of the radio-frequency module according to Embodiment 2.

FIGS. 9A and 9B are plan views respectively illustrating the layouts of the main surface 91a and an intermediate layer of the module substrate 91 of the radio-frequency module 1D according to this embodiment. As illustrated in FIGS. 9A and 9B, the circuit components 80 to 83 are the same as in Embodiment 1. In this embodiment, the circuit components 84A and 84B and 85A to 85C are disposed on the main surface 91a. The circuit component 84A and 84B and 85A to 85C are all SMD components.

The circuit component 84A includes the capacitor C21. The circuit component 84B includes the capacitor C11. The circuit component 85A includes the capacitor C12. The circuit component 85B includes the capacitor C22. The circuit component 85C includes the capacitor C3. The circuit components 84A, 84B, 85A, 85B, and 85C are chip capacitors including the corresponding capacitors.

As illustrated in FIGS. 9A and 9B, the primary coil L11 and the secondary coil L12 of the transformer T11 and the primary coil L21 and the secondary coil L22 of the transformer T21 each includes conductive layers provided on the main surface 91a of the module substrate 91 or inside the module substrate 91. The conductive layers are formed using a metal material such as copper and are wiring layers patterned into prescribed shapes. In this embodiment, the secondary coils L12 and L22 are provided on the main surface 91a and the primary coils L11 and L21 are provided inside the module substrate 91.

As illustrated in FIG. 9A, the secondary coil L12 of the transformer T11 includes a conductive layer 72A. The conductive layer 72A is an example of a second conductive layer provided on or in the module substrate 91. In this embodiment, the conductive layer 72A is provided on the main surface 91a.

The two ends of the conductive layer 72A form the terminals N13 and N14. Therefore, the terminals N13 and N14 are also provided on the main surface 91a. As illustrated in FIG. 9A, the terminal N13 overlaps the circuit component 85C in plan view. Specifically, the terminal N13 is electrically connected to an electrode terminal of the circuit component 85C.

The conductive layer 72A includes a curved part 72Aa. The curved part 72Aa is an example of a second curved part that surrounds at least part of the circuit component 84A in plan view. The curved part 72Aa is shaped in plan view so as to surround three sides of the substantially rectangular circuit component 84A, but the curved part 72Aa is not limited to this shape. The curved part 72Aa may surround only two sides of the circuit component 84A.

The curved part 72Aa has a substantially annular shape in plan view. For example, as illustrated in FIG. 9A, the curved part 72Aa has a shape that follows the outline of a rounded-corner rectangle and one side thereof is open. The curved part 72Aa includes straight parts and curved parts, but is not limited to this configuration. The curved part 72Aa may entirely consist of curved parts. Alternatively, instead of the curved part 72Aa, a bent part including a straight part bent at a prescribed angle may be provided. The prescribed angle may be 90°, an acute angle, or an obtuse angle. These points also apply to curved parts 72Ba, 71Aa, and 71Ba described later.

The secondary coil L22 of the transformer T21 includes a conductive layer 72B. The conductive layer 72B is an example of a second conductive layer provided on or in the module substrate 91. In this embodiment, the conductive layer 72B is provided on the main surface 91a.

The two ends of the conductive layer 72B form the terminals N23 and N24. Therefore, the terminals N23 and N24 are provided on the main surface 91a. As illustrated in FIG. 9A, the terminal N23 is aligned with the terminal N14 and corresponds to the node N3. In other words, the conductive layer 72A and the conductive layer 72B are formed so as to be integrated with each other. A via, which is not illustrated, is connected to the terminal N24. The via is, for example, connected to the ground pattern 91g (refer to part (d) of FIG. 4).

The conductive layer 72B includes the curved part 72Ba. The curved part 72Ba is an example of a second curved part that surrounds at least part of the circuit component 84B in plan view. The curved part 72Ba is shaped in plan view so as to surround three sides of the substantially rectangular circuit component 84B, but the curved part 72Ba is not limited to this shape. The curved part 72Ba may surround only two sides of the circuit component 84B. The curved part 72Ba has a substantially annular shape in plan view. For example, as illustrated in FIG. 9A, the curved part 72Ba has a shape that follows the outline of a rounded-corner rectangle and is partially open.

In this embodiment, as illustrated in FIG. 9A, conductive layers 74A and 74B are provided that extend from the terminal N23 (node N3), which is an end portion of the conductive layer 72A. The end portion of the conductive layer 74A overlaps the circuit component 85A in plan view and is electrically connected to an electrode terminal of the circuit component 85A. The end portion of the conductive layer 74B overlaps the circuit component 84B in plan view and is electrically connected to an electrode terminal of the circuit component 84B. Thus, electrical connections between the capacitors C11 and C12 and the secondary coils L12 and L22 included in the phase conversion circuit 15A can be easily made on the main surface 91a of the module substrate 91.

As illustrated in FIG. 9B, the primary coil L11 of the transformer T11 includes the conductive layer 71A. The conductive layer 71A is an example of a first conductive layer provided on or in the module substrate 91. In this embodiment, the conductive layer 71A is provided inside the module substrate 91.

The two ends of the conductive layer 71A form the terminals N11 and N12. As illustrated in FIG. 9B, the terminals N11 and N12 overlap the circuit component 80 in plan view. Specifically, the terminals N11 and N12 are respectively electrically connected using vias (not illustrated) to the output terminals Pb1 and Pb2, which are electrode terminals of the circuit component 80.

The conductive layer 71A includes a curved part 71Aa. The curved part 71Aa is an example of a first curved part that surrounds at least part of the circuit component 84A in plan view. The curved part 71Aa is shaped in plan view so as to surround three sides of the substantially rectangular circuit component 84A, but the curved part 71Aa is not limited to this shape. The curved part 71Aa may surround only two sides of the circuit component 84A.

The curved part 71Aa has a substantially annular shape in plan view. For example, as illustrated in FIG. 9B, the curved part 71Aa has a shape that follows the outline of a rounded-corner rectangle and is partially open.

In this embodiment, as illustrated in FIG. 9B, a conductive layer 75A is provided that extends from the terminal N15, which corresponds to the center point of the conductive layer 71A. An end portion of the conductive layer 75A overlaps the circuit component 84A in plan view and is electrically connected to the circuit component 84A by a via.

The primary coil L21 of the transformer T21 includes a conductive layer 71B. The conductive layer 71B is an example of a first conductive layer provided on or in the module substrate 91. In this embodiment, the conductive layer 71B is provided inside the module substrate 91. The conductive layer 71B is provided in the same layer as the conductive layer 71A, but may instead be provided in a different layer.

The two ends of the conductive layer 71B form the terminals N21 and N22. As illustrated in FIG. 9B, the terminals N21 and N22 overlap the circuit component 80 in plan view. Specifically, the terminals N21 and N22 are respectively electrically connected using vias (not illustrated) to the output terminals Pb3 and Pb4, which are electrode terminals of the circuit component 80.

The conductive layer 71B includes the curved part 71Ba. The curved part 71Ba is an example of a first curved part that surrounds at least part of the circuit component 84B in plan view. The curved part 71Ba is shaped in plan view so as to surround three sides of the substantially rectangular circuit component 84B, but the curved part 71Ba is not limited to this shape. The curved part 71Ba may surround only two sides of the circuit component 84B. The curved part 71Ba has a substantially annular shape in plan view. For example, as illustrated in FIG. 9B, the curved part 71Ba has a shape that follows the outline of a rounded-corner rectangle and is partially open.

In this embodiment, as illustrated in FIG. 9B, a conductive layer 75B is provided that extends from the terminal N25, which corresponds to the center point of the conductive layer 71B. An end portion of the conductive layer 75B overlaps the circuit component 85B including the capacitor C22 in plan view and is electrically connected to the circuit component 85B including the capacitor C22 by a via.

2-3. Effects and so Forth

As described above, the radio-frequency module 1D according to this embodiment includes the module substrate 91 and the power amplification circuit 10A disposed on and in the module substrate 91. The power amplification circuit 10A includes the amplification elements P1 to P4, the transformer T11 including the primary coil L11 and the secondary coil L12, the transformer T21 including the primary coil L21 and the secondary coil L22, the output terminal Pout to which one end of the secondary coil L12 is connected, and a circuit component disposed on the main surface 91a of the module substrate 91. One end of the primary coil L11 is connected to the output terminal Pb1 of the amplification element P1. The other end of the primary coil L11 is connected to the output terminal Pb2 of the amplification element P2. One end of the primary coil L21 is connected to the output terminal Pb3 of the amplification element P3. The other end of the primary coil L21 is connected to the output terminal Pb4 of the amplification element P4. The other end of the secondary coil L12 is connected to one end of the secondary coil L22. The capacitors C11 and C12 are connected to a wiring line path connected between the other end of the secondary coil L12 and the one end of the secondary coil L22. At least one out of the primary coil L11, the secondary coil L12, the primary coil L21, and the secondary coil L22 includes a conductive layer provided on or in the module substrate 91. The conductive layer surrounds at least part of the circuit component when the module substrate 91 is viewed in plan view. For example, the part that surrounds at least part of the circuit component is a curved part. In addition, for example, the circuit component is disposed inside the outer-peripheral-side outline of the curved part in plan view.

Thus, the region inside the curved part can be effectively used as a region in which to mount the circuit component. Therefore, this can contribute to reducing the size of the radio-frequency module 1D.

The circuit component surrounded by the curved part 72Aa or 72Ba is not particularly limited. For example, the circuit component 85A including the capacitor C12 may be surrounded by the curved part 72Aa instead of the circuit component 84A. Alternatively, the circuit component 85B including the capacitor C22 may be surrounded by the curved part 72Ba instead of the circuit component 84B. In addition, a plurality of circuit components may be surrounded by one curved part. For example, the circuit components 84B and 85A may be surrounded by the curved part 72Ba.

In addition, the conductive layer 72A (secondary coil L12) of the transformer T11 and the conductive layer 72B (secondary coil L22) of the transformer T21 may be provided in different layers. In this case, the conductive layers 72A and 72B are electrically connected to each other by a via or the like.

Other Matters

Although radio-frequency modules and a communication device have been described above on the basis of embodiments of the present disclosure, the present disclosure is not limited to the above embodiments.

For example, in the embodiments and modifications, examples have been illustrated in which four amplification elements P1 to P4 are integrated into a single circuit component 80, but the present disclosure is not limited to this configuration. For example, the amplification elements P1 and P2 of the carrier amplifier 13 and the amplification elements P3 and P4 of the peak amplifier 14 may be included in different circuit components. Alternatively, the four amplification elements P1 to P4 may be each included in a different circuit component.

Furthermore, in Embodiment 1 and each modification, the conductive layer 71 included in the primary coil L11 does not have to be provided on the main surface 91a of the module substrate 91. For example, the conductive layer 71 may be provided inside the module substrate 91. This also applies to the wiring lines 63 and 64. In addition, the order in which the conductive layers 61a, 62a, 71, and 72 are disposed in the thickness direction of the module substrate 91 is not particularly limited.

Furthermore, for example, the wiring line lengths of the wiring lines 61 and 62 do not have to be equal to each other. If the wiring line lengths are not equal to each other, the inductance values can be made equal to each other by making the widths of the wiring lines 61 and 62 different from each other. This also applies to the wiring lines 63 and 64.

Furthermore, for example, the inductor components of wiring lines are used as the inductors L1 to L4, but the present disclosure is not limited to this configuration. At least one out of the inductors L1 to L4 may include a chip inductor.

In addition, for example, the arrangements and shapes of the conductive layers and components are merely examples and are not limited to the above-described examples.

In addition, the present disclosure also includes embodiments obtained by making various modifications, as conceived of by those skilled in the art, to the above embodiments and embodiments realized by appropriately combining the constituent elements and functions of the above embodiments so long as the resulting embodiments do not depart from the gist of the present disclosure.

The present disclosure can be widely used in communication devices such as mobile phones as a radio-frequency module that is arranged in a multi-band front end unit.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio-frequency module comprising:
a module substrate; and
a power amplification circuit on or in the module substrate,
wherein the power amplification circuit comprises:
a first amplification circuit element, a second amplification circuit element, a third amplification circuit element, and a fourth amplification circuit element,
a transformer having a primary coil and a secondary coil,
an output terminal to which a first end of the secondary coil is connected, and
a first circuit component on a main surface of the module substrate,
wherein an output terminal of the first amplification circuit element and an output terminal of the third amplification circuit element are connected to a first terminal of the primary coil,
wherein an output terminal of the second amplification circuit element and an output terminal of the fourth amplification circuit element are connected to a second terminal of the primary coil,
wherein a first capacitance element is connected at a first end to a first wiring line path and at a second end to a second wiring line path, the first wiring line path connecting the output terminal of the first amplification circuit element to the first terminal, and the second wiring line path connecting the output terminal of the second amplification circuit element to the second terminal,
wherein one of the primary coil or the secondary coil comprises a first conductive layer on the module substrate,
wherein the first conductive layer on the module substrate surrounds at least part of the first circuit component on the module substrate when the module substrate is viewed in a plan view,
wherein the other one of the primary coil or the secondary coil comprises a second conductive layer that is in a different layer inside the module substrate than the first conductive layer,
wherein the second conductive layer surrounds at least part of the first circuit component when the module substrate is viewed in the plan view, and
wherein the first circuit component comprises the first capacitance element.

2. The radio-frequency module according to claim 1, wherein the first circuit component is not outside the first conductive layer when the module substrate is viewed in the plan view.

3. The radio-frequency module according to claim 1, wherein the first wiring line path comprises:
a first wiring line connected between the output terminal of the first amplification circuit element and a first connection point to which the first end of the first capacitance element is connected, and
a third wiring line connected between the first connection point and the first terminal, and
wherein the second wiring line path comprises:
a second wiring line connected between the output terminal of the second amplification circuit element and a second connection point to which the second end of the first capacitance element is connected, and
a fourth wiring line connected between the second connection point and the second terminal.

4. The radio-frequency module according to claim 3, wherein a wiring line length of the first wiring line is equal to a wiring line length of the second wiring line.

5. The radio-frequency module according to claim 3, wherein at least part of the first wiring line and at least part of the second wiring line are in a different layer of the module substrate than the first conductive layer.

6. The radio-frequency module according to claim 3, wherein a wiring line length of the third wiring line is equal to a wiring line length of the fourth wiring line.

7. The radio-frequency module according to claim 6, wherein the third wiring line and the fourth wiring line are on the main surface.

8. The radio-frequency module according to claim 3, wherein the first circuit component, the third wiring line, and the fourth wiring line are arranged axisymmetrically with respect to an imaginary common axis.

9. The radio-frequency module according to claim 1,
wherein the primary coil has a third terminal that is different than the first terminal and the second terminal, and
wherein the first circuit component comprises a second capacitance element connected to the third terminal and to ground.

10. The radio-frequency module according to claim 1,
wherein the primary coil comprises the first conductive layer, and
wherein the first conductive layer, the first terminal, and the second terminal are on the main surface.

11. The radio-frequency module according to claim 10,
wherein the third amplification circuit element and the fourth amplification circuit element are in a second circuit component on the main surface, and
the second circuit component overlaps the first terminal and the second terminal when the module substrate is viewed in the plan view.

12. The radio-frequency module according to claim 10,
wherein the third amplification circuit element and the fourth amplification circuit element are in a second circuit component on the main surface, and
wherein the second circuit component is connected to the first terminal and to the second terminal with wire bonding.

13. The radio-frequency module according to claim 1, wherein the first circuit component and the first conductive layer are arranged axisymmetrically with respect to an imaginary common axis.

14. The radio-frequency module according to claim 1, further comprising:
a ground pattern that is on or in the module substrate and that overlaps the entirety of the transformer when the module substrate is viewed in the plan view.

15. The radio-frequency module according to claim 1,
wherein the first amplification circuit element and the second amplification circuit element are configured to receive first radio-frequency signals having the same amplitude and opposite phases, respectively, and
wherein the third amplification circuit element and the fourth amplification circuit element are configured to receive second radio-frequency signals having the same amplitude and opposite phases, respectively.

16. The radio-frequency module according to claim 15, wherein the first radio-frequency signals are signals that are split from an input signal input to the power amplification circuit when a power level of the input signal is greater than or equal to a first level, wherein the second radio-frequency signals are signals that are split from the input signal when the power level of the input signal is greater than or equal to a second level, and are signals whose phases are shifted from those of the first radio-frequency signals, and wherein the second level is greater than the first level.

17. The radio-frequency module according to claim 1, wherein the first circuit component is a chip capacitor.

18. A communication device comprising:
a radio frequency (RF) signal processing circuit configured to process a radio-frequency signal transmitted or received by an antenna; and
the radio-frequency module according to claim 1 configured to pass the radio-frequency signal between the antenna and the RF signal processing circuit.

* * * * *